(12) United States Patent  (10) Patent No.: US 7,760,552 B2
Miyake et al.  (45) Date of Patent: Jul. 20, 2010

(54) VERIFICATION METHOD FOR NONVOLATILE SEMICONDUCTOR MEMORY DEVICE

(75) Inventors: Hiroyuki Miyake, Kanagawa (JP); Mitsuaki Osame, Atsugi (JP); Aya Miyazaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/729,216

(22) Filed: Mar. 28, 2007

(65) Prior Publication Data

US 2007/0230249 A1 Oct. 4, 2007

(30) Foreign Application Priority Data

Mar. 31, 2006 (JP) ............................. 2006-101262

(51) Int. Cl.
 *G11C 11/34* (2006.01)
(52) U.S. Cl. ............................. 365/185.22; 365/185.24
(58) Field of Classification Search ............ 365/185.22, 365/185.24
See application file for complete search history.

(56) References Cited

U.S. PATENT DOCUMENTS

| 3,878,549 | A |   | 4/1975  | Yamazaki et al. |
| 5,345,418 | A | * | 9/1994  | Challa ................. 365/185.17 |
| 5,463,587 | A |   | 10/1995 | Maruyama |
| 6,038,167 | A |   | 3/2000  | Miwa et al. |
| 6,108,238 | A |   | 8/2000  | Nakamura et al. |
| 6,154,391 | A |   | 11/2000 | Takeuchi et al. |
| 6,172,912 | B1|   | 1/2001  | Hirano et al. |
| 6,556,475 | B2|   | 4/2003  | Yamazaki et al. |
| 6,577,531 | B2|   | 6/2003  | Kato |
| 6,646,922 | B2|   | 11/2003 | Kato |
| 6,768,680 | B2|   | 7/2004  | Kato |
| 7,554,854 | B2|   | 6/2009  | Osame et al. |
| 2002/0179964 | A1 |   | 12/2002 | Kato et al. |
| 2004/0132248 | A1 | * | 7/2004  | Huang ........................ 438/257 |

(Continued)

FOREIGN PATENT DOCUMENTS

JP 51-7036 3/1976

(Continued)

OTHER PUBLICATIONS

Masuoka, F., "Rapidly-Advancing Flash Memory," FIG. 4.11, K Books Series 177, May 10, 2003, p. 150 (with partial English translation).

*Primary Examiner*—Michael T Tran
(74) *Attorney, Agent, or Firm*—Husch Blackwell Sanders LLP

(57) ABSTRACT

The present invention provides nonvolatile semiconductor memory devices which operate with low power consumption. In a nonvolatile semiconductor memory device, a plurality of nonvolatile memory elements are connected in series. The plurality of nonvolatile memory elements include a semiconductor layer including a channel forming region and a control gate provided to overlap with the channel forming region. Operations of write, erase, a first read, and a second read in a verify operation of data to the nonvolatile memory elements, are conducted by changing voltage to the control gates of the nonvolatile memory elements. The second read in the verify operation after erase operation is conducted by changing only one of a potential of the control gate of a nonvolatile memory element which are selected from the plurality of nonvolatile memory elements, and as the potential, a potential different from a potential of the first read is used.

26 Claims, 31 Drawing Sheets

U.S. PATENT DOCUMENTS

| | | | |
|---|---|---|---|
| 2004/0202025 A1* | 10/2004 | Seki et al. | 365/185.29 |
| 2004/0240269 A1* | 12/2004 | Cernea | 365/185.12 |
| 2005/0057968 A1* | 3/2005 | Lutze et al. | 365/185.18 |
| 2007/0221971 A1 | 9/2007 | Yamazaki et al. | |
| 2007/0221983 A1* | 9/2007 | Lojek | 257/315 |
| 2007/0221985 A1 | 9/2007 | Yamazaki et al. | |
| 2007/0228452 A1 | 10/2007 | Asami | |
| 2007/0235793 A1 | 10/2007 | Yamazaki et al. | |
| 2007/0235794 A1 | 10/2007 | Yamazaki et al. | |

FOREIGN PATENT DOCUMENTS

| | | |
|---|---|---|
| JP | 52-23532 | 6/1977 |
| JP | 55-15869 | 4/1980 |
| JP | 2005-347328 | 12/2005 |

* cited by examiner

FIG. 23
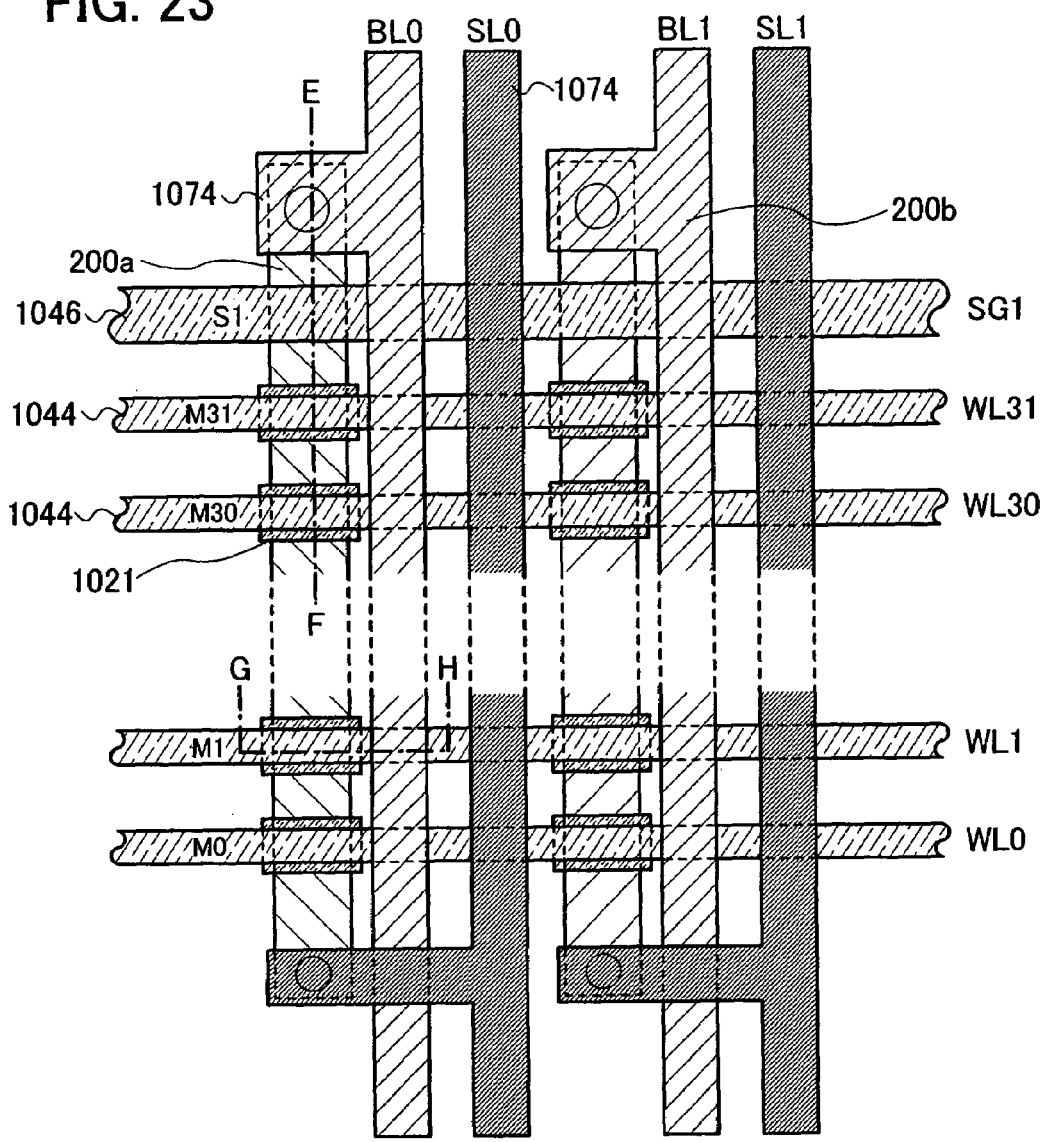
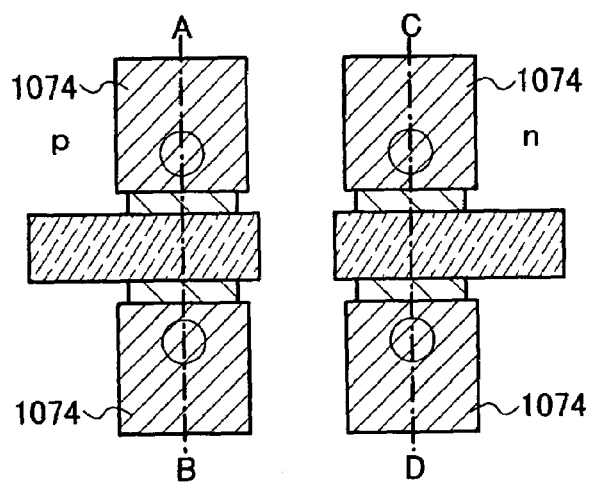

FIG. 24
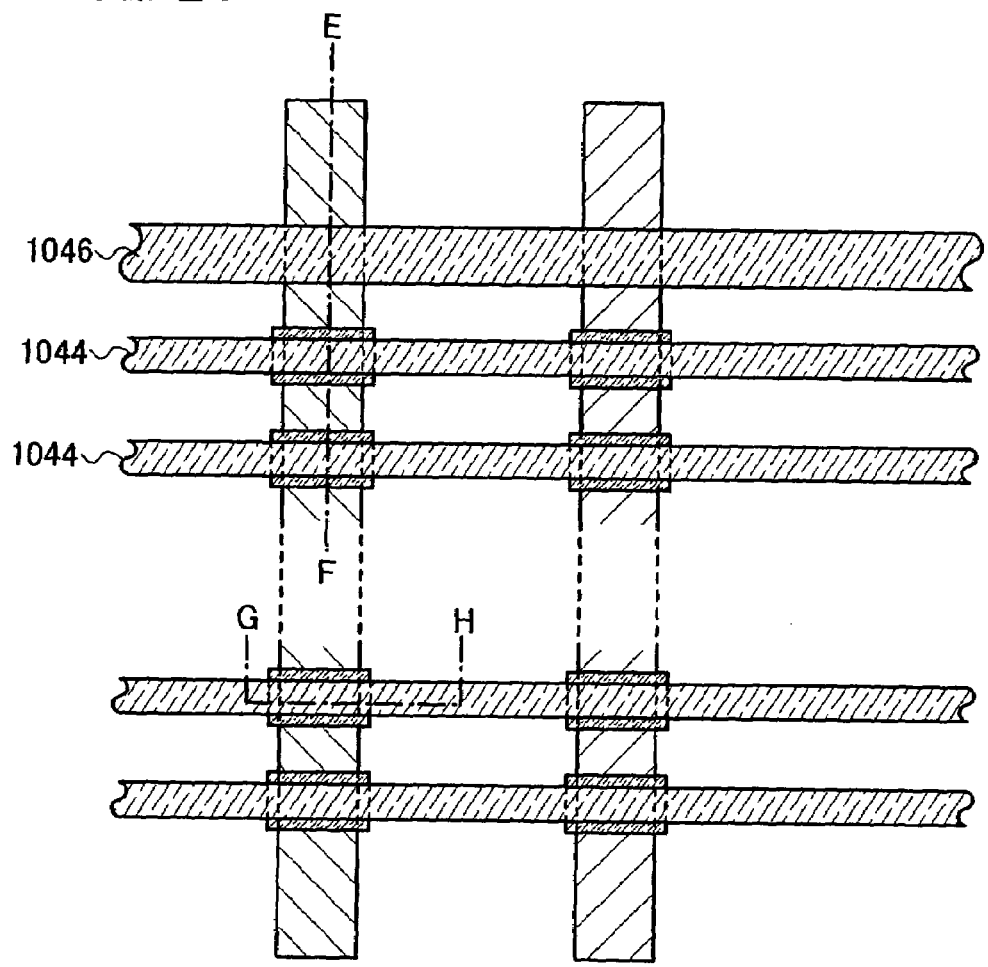
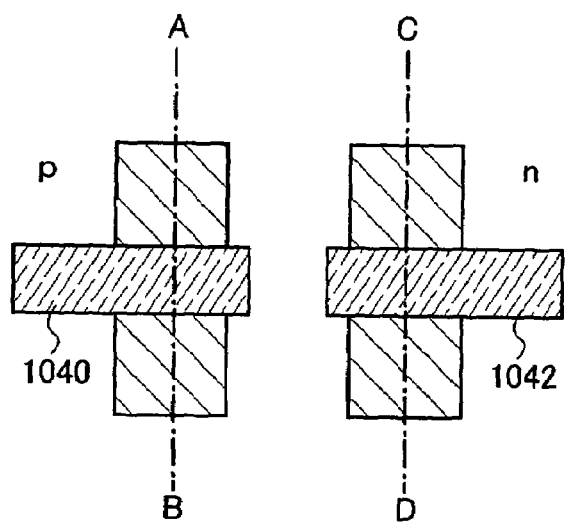

FIG. 25
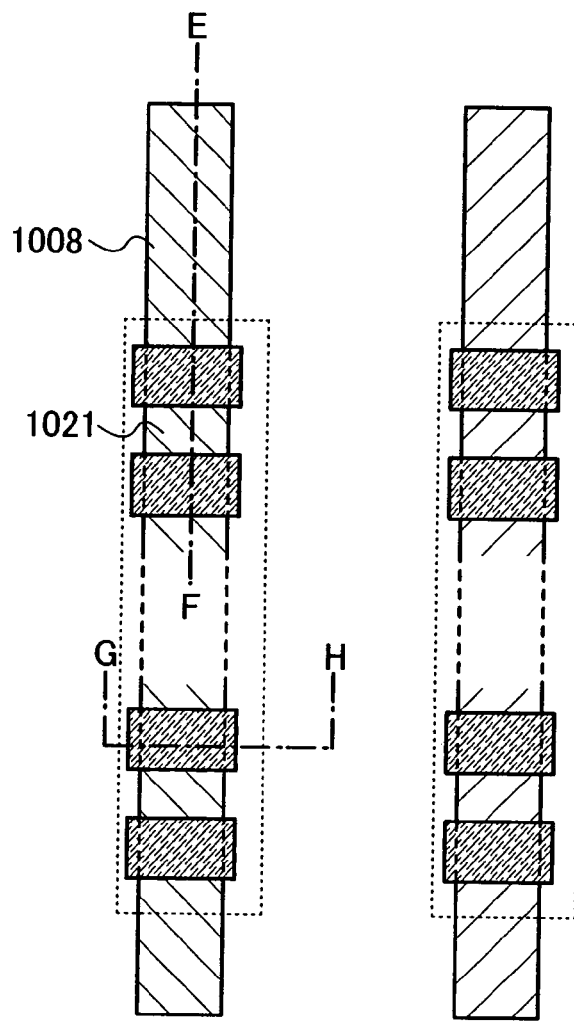
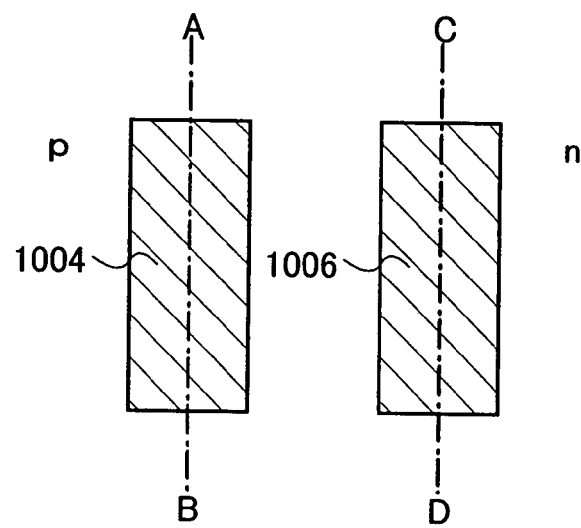

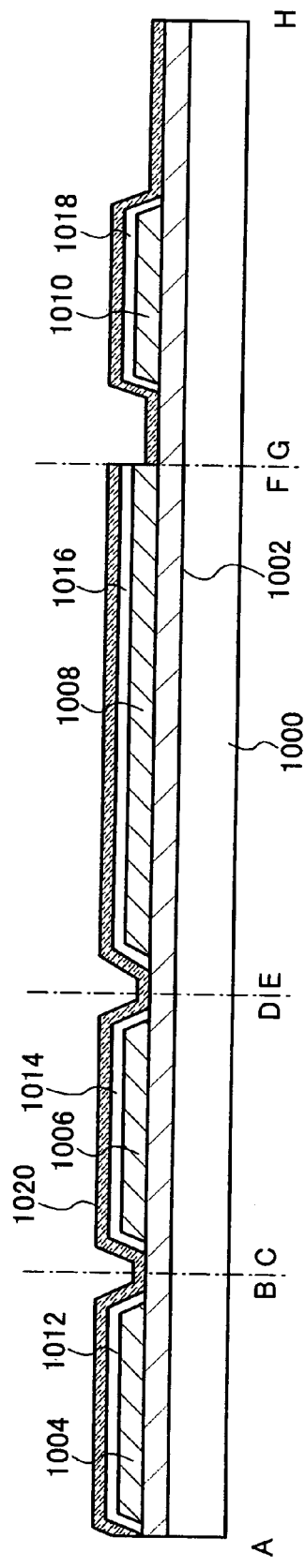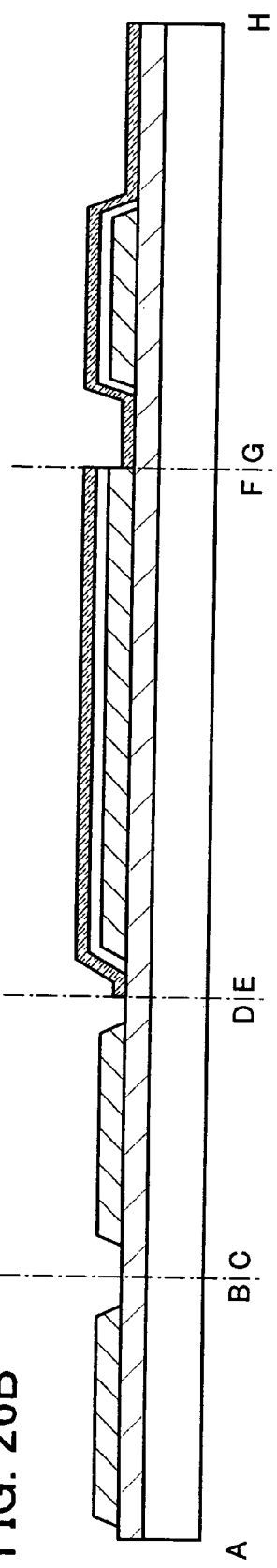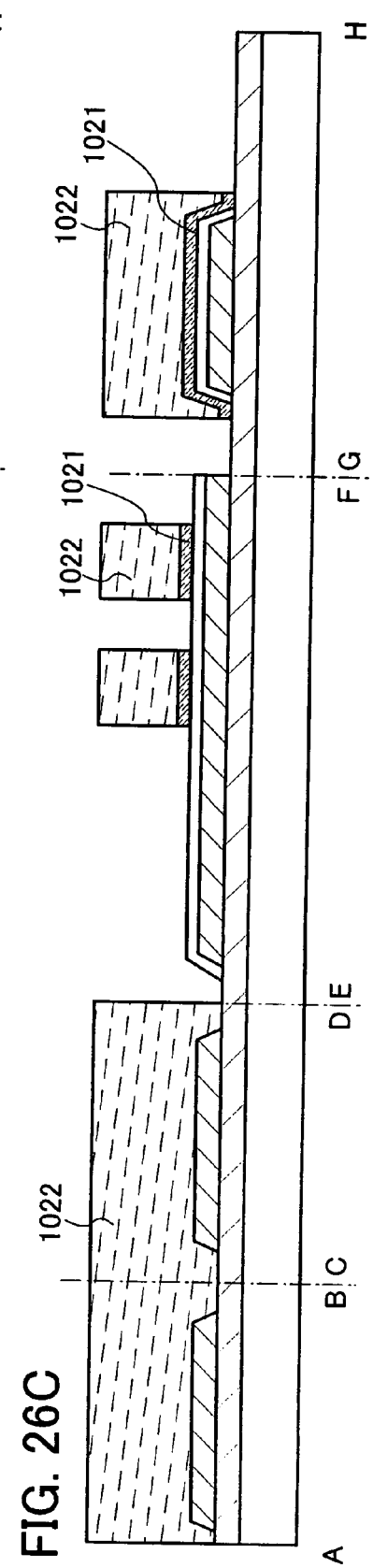

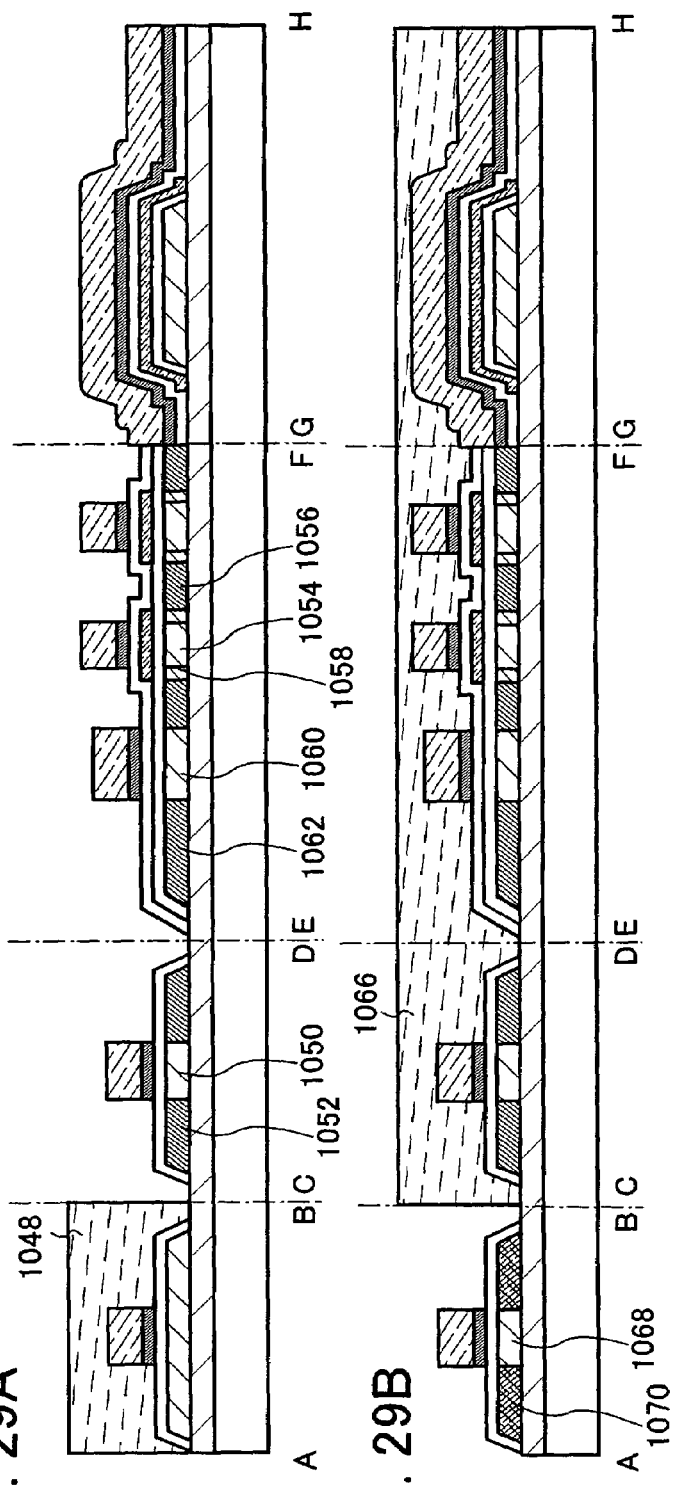
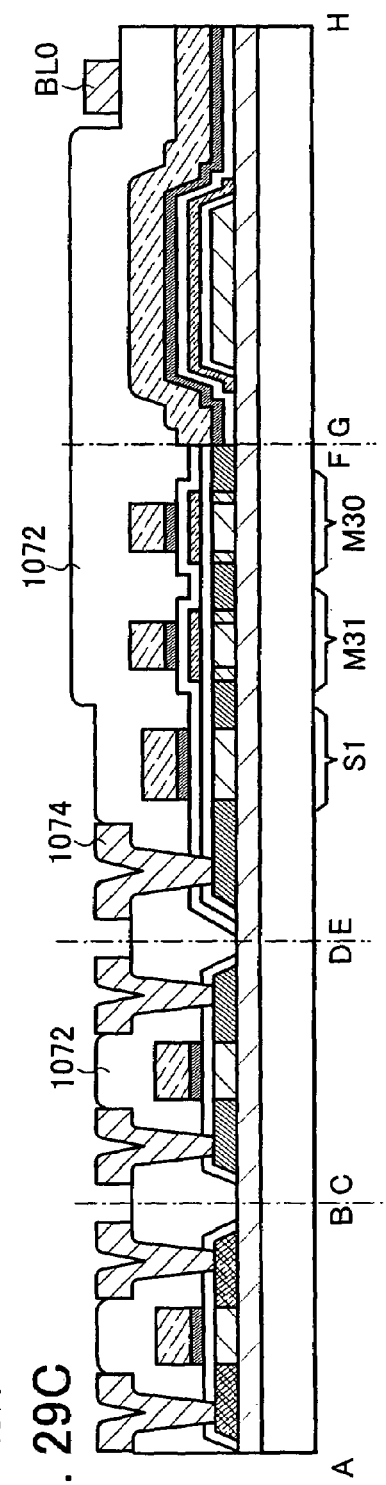
FIG. 29A
FIG. 29B
FIG. 29C

VERIFICATION METHOD FOR NONVOLATILE SEMICONDUCTOR MEMORY DEVICE

BACKGROUND OF THE INVENTION

1. Field of the Invention

The present invention relates to nonvolatile semiconductor memory devices which can write, read and erase data electrically.

2. Description of the Related Art

As semiconductor memories, there are a DRAM (Dynamic Random Access Memory), SRAM (Static Random Access Memory), a flash memory, an EEPROM (Electrically Erasable Programmable Read Only Memory) and the like. An EEPROM is used for mobile devices such as digital audio players (DAP), and thus, large capacity, high precision, and low power consumption are important for an EEPROM.

In an EEPROM, it is usual that verify write or verify erase is conducted, which includes an operation for verifying that a state after writing or erasing is in a predetermined range. In particular, in a nonvolatile memory which operates at a low voltage, it is necessary to control a state after writing or erasing with high accuracy and thus, such a verify operation is essential.

In the verify write/erase operation, an operation period in which a fixed period of write/erase operation is conducted, and a read period for verifying that a state after writing or erasing is in a predetermined range are conducted alternately. FIG. 2 and FIG. 3 show this state. FIG. 2 is a simple block diagram, in which a read circuit 202 and a write/erase circuit 201 are connected to a selected memory cell 203. A verify signal Sv is output from the read circuit 202, and is input to the write/erase circuit 201. The write/erase circuit 201 conducts write/erase in response to the verify signal Sv. FIG. 3 shows a procedure of the verify write/erase. In FIG. 3, the read circuit operates (this state is referred to as "active") first, so that read is conducted. At that time, the write/erase circuit does not operate (this state is referred to as "not active"). The verify signal Sv output from the read circuit is Low when a state of the memory cell when data is read is different from an intended state, while the verify signal Sv is High when a state of the memory cell when data is read is the same as an intended state. When the verify signal Sv is Low, the write/erase circuit operates (active) after the termination of a read operation, and a fixed period of write/erase operation is conducted. Subsequently, read is conducted again and a state of the memory cell is compared with an intended state. Similarly, when the verify signal Sv is Low, a fixed period of write/erase operation is conducted again. These operations are repeated, and when the verify signal Sv is High, the verify write/erase operation is terminated. In this manner, the verify operation is conducted.

Further, as for EEPROMs, there are various types such as a NOR type, a NAND type and an AND type depending on a structure and a driving method of a memory cell.

In general, a NAND type can increase the integration degree more than a NOR type. This is because in the NAND type, the total number of memory elements and transistors necessary for storing information per one bit can be more reduced. However, in the NAND type, a threshold voltage of a memory element is necessary to be controlled with higher accuracy than the NOR type, and in view of this point, the verify operation is essential (Reference 1: Fujio Masuoka "Rapidly-Advancing Flash Memory (revised new version)", first edition, May 2003, p. 150 (FIG. 4. 11)).

SUMMARY OF THE INVENTION

FIG. 4 shows electric characteristics of a single memory element. Two curves show a case where data 1 is stored and a case where data 0 is stored. Shifting the characteristic curve when data 0 is stored to the characteristic curve when data 1 is stored by injecting electrons to a floating gate is called "write". On the other hand, shifting the characteristic curve when data 1 is stored to the characteristic curve when data 0 is stored by extracting electrons from the floating gate is called "erase". In a NAND type memory, at the time of read, a potential which turns on, i.e., a sufficient current flows, for the characteristic curve when data 0 is stored, and turns off, i.e., no current flows, for the characteristic curve when data 1 is stored (hereinafter, also referred to as VGM) is set to a selected word line. Memory elements controlled by the other word lines than the word line selected from among the word lines for controlling the memory elements belonging to the same NAND cell are given a potential of turning on, for the both characteristic curves, in other words, a potential (VGH) for supplying current sufficiently irrespective of the stored data. If a distribution of threshold voltages of the memory elements is wide, so it is necessary to set a potential such as VGH, high, and power consumption becomes large.

The present invention has been in view of the above problems. It is an object of the present invention to provide nonvolatile semiconductor memory devices with low power consumption. Further, it is another object of the present invention to provide semiconductor devices including the nonvolatile semiconductor memory devices.

One mode of the present invention is a verify method of a nonvolatile semiconductor memory device having a plurality of nonvolatile memory elements which are connected in series. The plurality of nonvolatile memory elements each has a semiconductor layer including a channel forming region between a pair of impurity regions which are formed to be separated from each other; a first insulating layer; a floating gate; a second insulating layer; and a control gate which are provided to overlap with the channel forming region. Operations of write, erase, a first read and a second read in a verify operation of data to the nonvolatile memory elements, are conducted by changing voltage to the control gates of the nonvolatile memory elements. The second read in the verify operation is conducted by changing a potential of the control gate of a nonvolatile memory element which are selected from the plurality of nonvolatile memory elements, and the potential is different from a potential of the first read.

In the above structure, the floating gate is formed from a semiconductor material having a smaller energy gap than the semiconductor layer. Alternatively, the floating gate is formed from germanium or a germanium compound.

One mode of the present invention is a verify method of a nonvolatile semiconductor memory device having a plurality of nonvolatile memory elements which are connected in series. The plurality of nonvolatile memory elements each has a semiconductor layer including a channel forming region between a pair of impurity regions which are formed to be separated from each other; a first insulating layer; a floating gate; a second insulating layer; and a control gate which are provided to overlap with the channel forming region. And the floating gate is formed with at least a first layer and a second layer. Operations of write, erase, a first read and a second read in a verify operation of data to the nonvolatile memory elements, are conducted by changing voltage to the control gates of the nonvolatile memory elements. The second read in the verify operation is conducted by changing a potential of the control gate of a nonvolatile memory element which are selected from the plurality of nonvolatile memory elements, and the potential is different from a potential of the first read.

In the above structure, the first layer in contact with the first insulating layer is formed from a semiconductor material having a smaller energy gap than the semiconductor layer. Alternatively, the first layer in contact with the first insulating layer is formed from germanium or a germanium compound.

One mode of the present invention is a verify method of a semiconductor device having a plurality of nonvolatile memory elements which are connected in series. A potential of a control gate of a selected one of the plurality of nonvolatile memory elements is set to a first potential and a potential of control gates of the other nonvolatile memory elements are set to a second potential for erasing a data stored in the selected one of the plurality of nonvolatile memory elements. A potential of a control gate of the selected one of the plurality of nonvolatile memory elements is set to a third potential and a potential of control gates of the other nonvolatile memory elements are set to the second potential for reading a data stored in the selected one of the plurality of nonvolatile memory elements after erasing a data stored in the selected one of the plurality of nonvolatile memory elements.

In another mode of the present invention, paper money, coins, securities, certificates, bearer bonds, packaging containers, books, recording media, vehicles, foods, clothing, health products, commodities, chemicals, or electronic devices which are provided with the nonvolatile semiconductor memory devices can be provided.

In accordance with the present invention, in a verify operation for erase, read and erase of data can be conducted by changing only a potential of a control gate of a memory element selected from among a plurality of rewritable nonvolatile memory elements connected in series. Therefore, power consumption can be reduced drastically.

BRIEF DESCRIPTION OF THE DRAWINGS

In the accompanying drawings:

FIG. 23 shows an example of a top view of a nonvolatile semiconductor memory device according to an aspect of the present invention;

FIG. 24 shows an example of a top view of a nonvolatile semiconductor memory device according to an aspect of the present invention;

FIG. 25 shows an example of a top view of a nonvolatile semiconductor memory device according to an aspect of the present invention;

FIGS. 26A to 26C show an example of a manufacturing method of a nonvolatile semiconductor memory device according to an aspect of the present invention;

FIGS. 29A to 29C show an example of a manufacturing method of a nonvolatile semiconductor memory device according to an aspect of the present invention;

DETAILED DESCRIPTION OF THE INVENTION

Embodiment Modes

Figure 1:
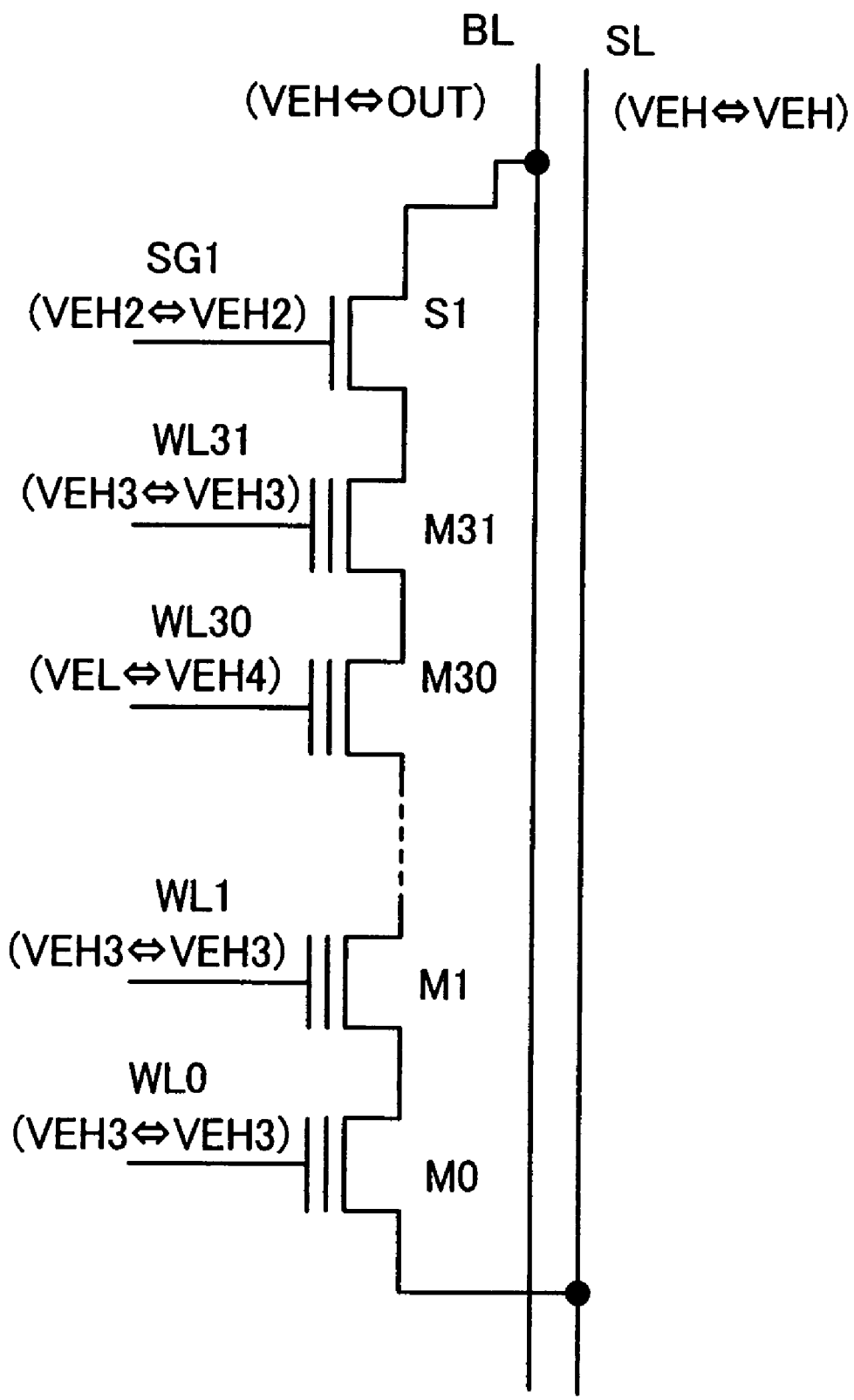
FIG. 1 shows a potential change of each control line in a verify operation for erase.
Figure 2:
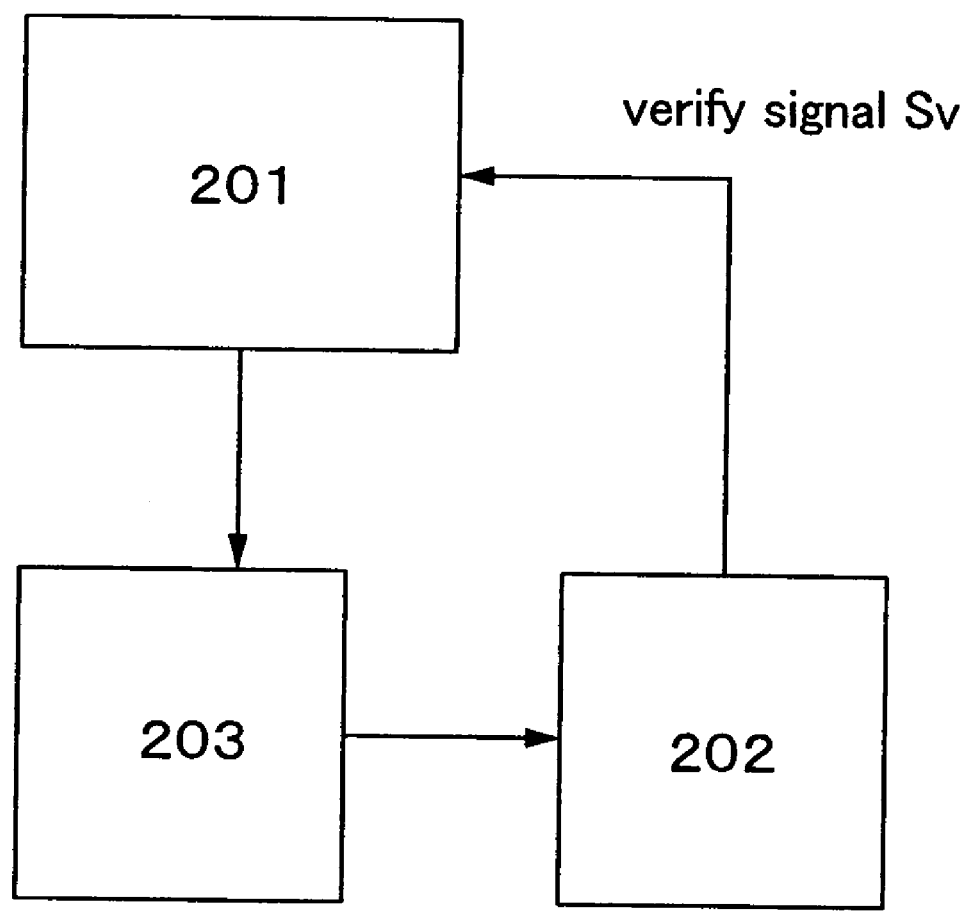
FIG. 2 is a block diagram showing a verify operation of a conventional nonvolatile memory.
Figure 3:
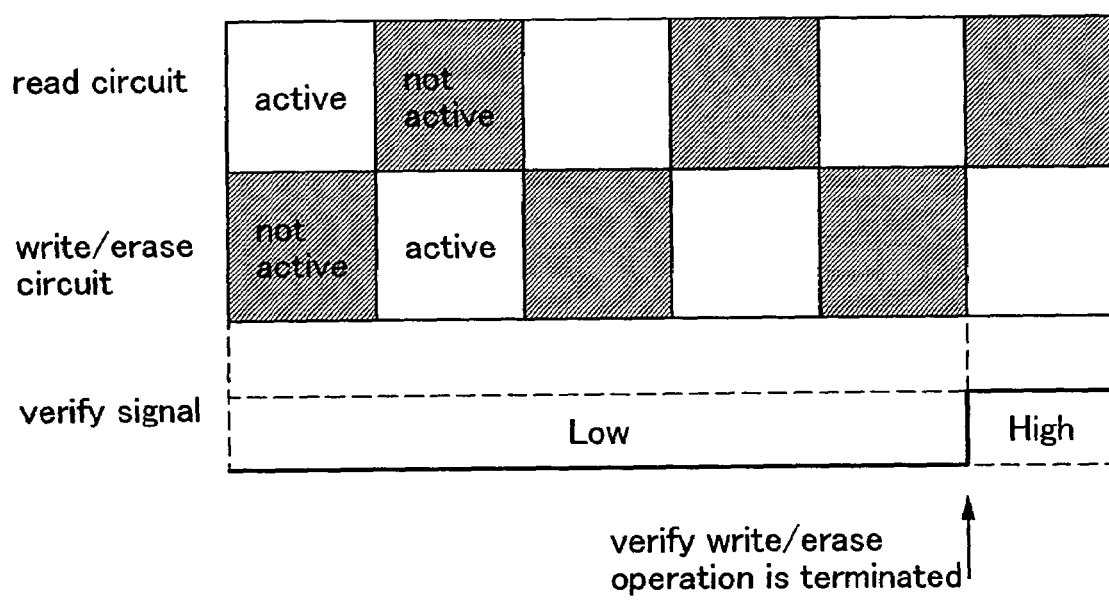
FIG. 3 is a block diagram showing a verify operation of a conventional nonvolatile memory.
Figure 4:
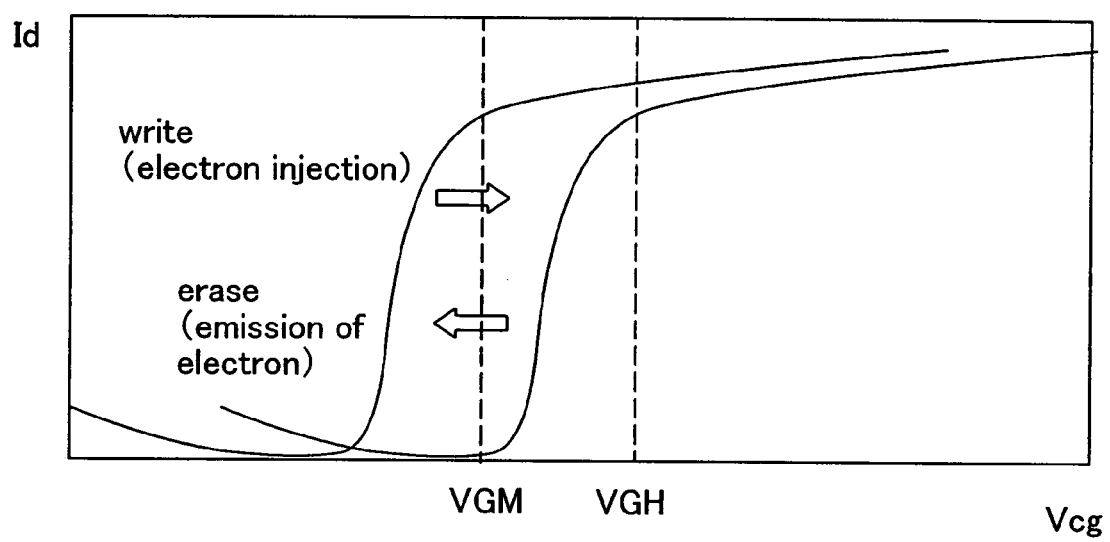
FIG. 4 shows electric characteristics of a single memory element.

Hereinafter, Embodiment Modes of the present invention will be described with reference to the drawings. Note that the present invention can be carried out in many different modes. It is easily understood by those skilled in the art that modes and details disclosed herein can be modified in various ways without departing from the spirit and the scope of the present invention. Therefore, it should be noted that the present invention should not be interpreted as being limited to the description of the embodiment modes given below. Note that like portions or portions having a like function are denoted by the same reference numerals through the drawings, and therefore, description thereon is omitted.

Embodiment Mode 1

Embodiment Mode 1 will describe a structure and an operation of a nonvolatile semiconductor memory device (also referred to as a nonvolatile memory) of the present invention.

Figure 9:
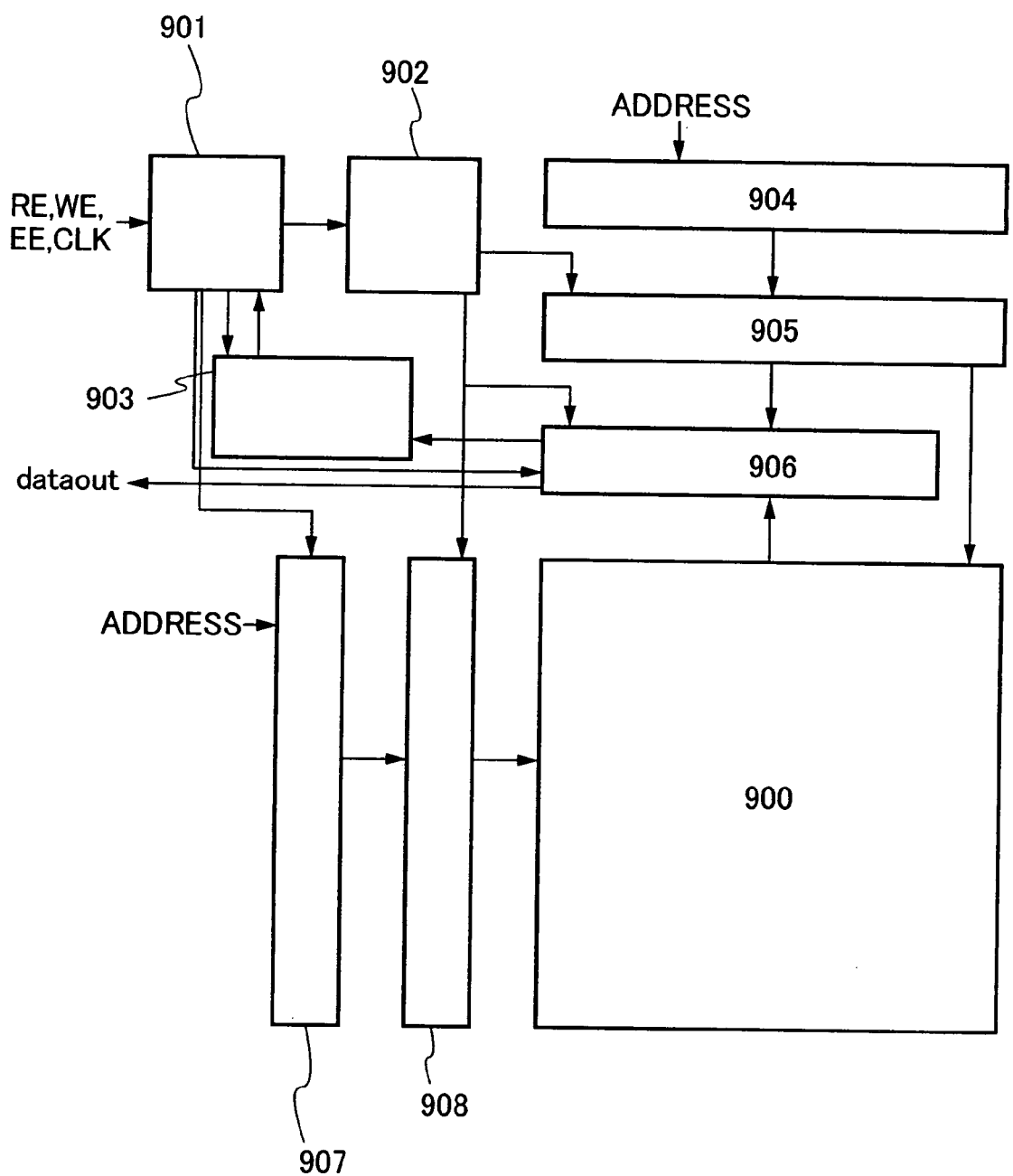
FIG. 9 shows an example of a block diagram of a nonvolatile semiconductor memory device according to an aspect of the present invention.

FIG. 9 is a block diagram showing an example of a nonvolatile semiconductor memory device of the present invention. The nonvolatile semiconductor memory device includes a memory cell array 900, a timing generator 901, a power source controller 902, a verify circuit 903, a column decoder 904, a C selector 905, a read circuit 906, a row decoder 907, and an R selector 908.

To the timing generator 901, a write enable (WE) signal, an erase enable (EE) signal, a read enable (RE) signal and/or a clock (CLK) signal are input from the outside. In addition, a judgment signal is input from the verify circuit. By the timing generator 901, a control signal is input into the power source controller 902, the verify circuit 903, the read circuit 906, and the row decoder 907. A different signal is supplied depending on which of write, erase or read is conducted.

The power source controller 902 supplies an appropriate power to the C selector 905, the read circuit 906 and the R selector 908 in response to the control signal input from the timing generator 901.

An address is input into the column decoder 904, and the column decoder 904 selects a column in response to the address. The C selector 905 supplies an appropriate power to a bit line and a source line in the column selected by the column decoder 904. An address is input into the row decoder 907, and the row decoder 907 selects a row in response to the address. The R selector 908 supplies an appropriate power to a selection line and a word line in the row selected by the row decoder 907.

The read circuit 906 is used when a read enable (RE) signal is asserted and during the verify operation. Data of the selected memory element is read and the value of the data is output to the outside or the verify circuit.

A read operation is conducted by asserting the read enable signal. When the read enable signal is asserted, a memory element that is specified by the address signal is selected, and then, data is read from the selected memory element via the read circuit.

A write operation is conducted by asserting the write enable signal. When the write enable signal is asserted, a memory element that is specified by the address signal is selected, and then, data 1 is written to the selected memory element. After writing data 1, data stored in the selected memory element and data to be written are compared, so that a result of write is confirmed. When the both data agree each other, it is considered that the write operation is conducted normally and the write operation is terminated. When the both data do not agree, it is considered that write is not done sufficiently and write is conducted again, and data stored in the selected memory element and data 1 are compared again. When the both data agree, repetition is stopped to terminate the write operation.

An erase operation is conducted by asserting the erase enable signal. When the erase enable signal is asserted, a memory element that is specified by the address signal is selected, and then, data 0 is written to the selected memory element. After erasing the data, data stored in the selected memory element and data to be input are compared, so that a result of write of data 0 is confirmed. When the both data agree each other, it is considered that the erase operation is conducted normally and the erase operation is terminated. When the both data do not agree, it is considered that erase is not done sufficiently and erase is conducted again, and data stored in the selected memory element and data 0 are compared again. When the both data agree, repetition is stopped to terminate the erase operation.

Figure 11:
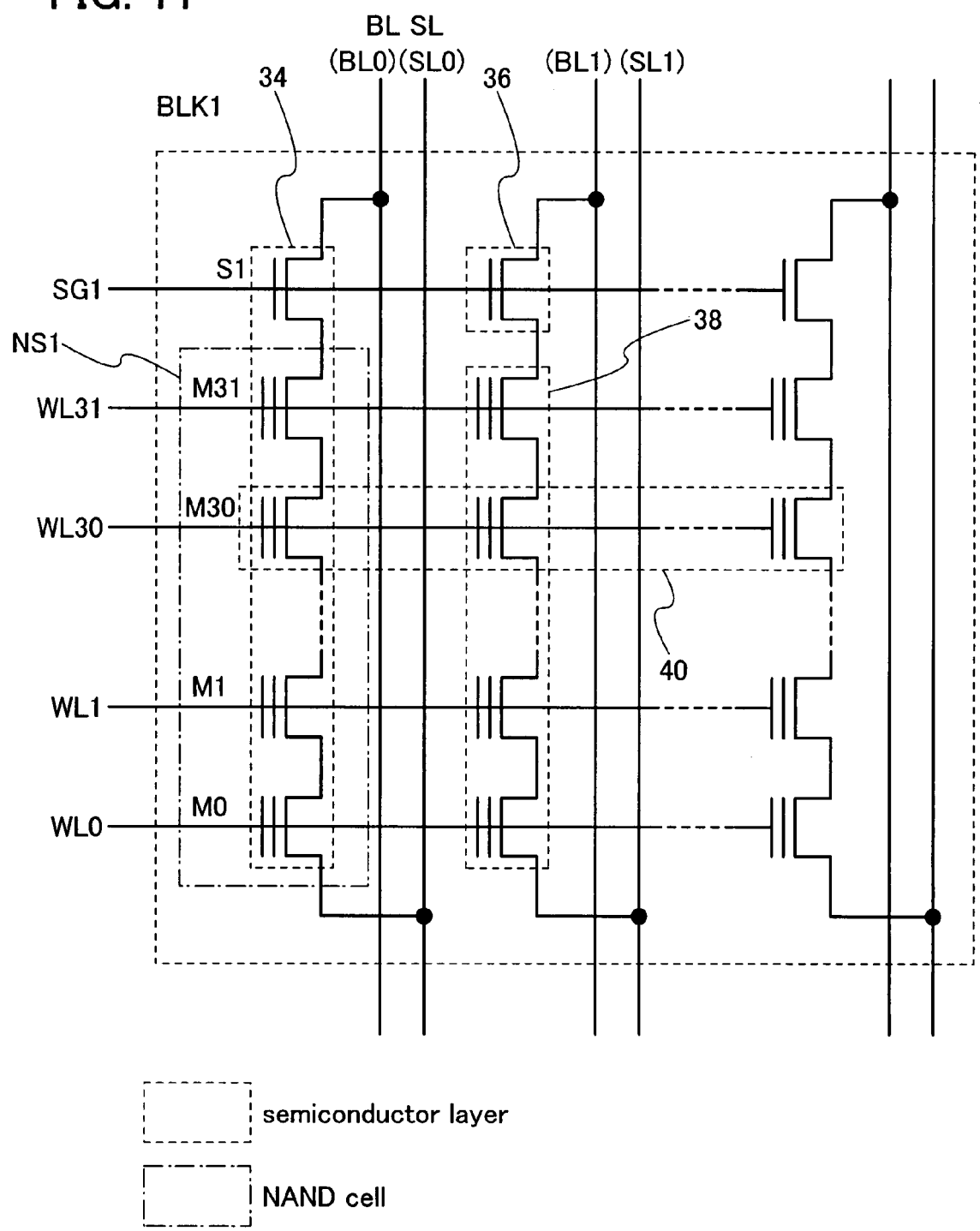
FIG. 11 shows an example of an equivalent circuit of a NAND type memory cell array.

The memory cell array 900 includes a plurality of memory cells. An example of using a NAND type is given here, and FIG. 11 shows an equivalent circuit of a NAND type memory cell array. To a bit line BL is connected a NAND cell NS1 in which a plurality of nonvolatile memory elements (M0 to M31) are connected in series. A plurality of NAND cells constitute a block BLK. The number of word lines in a block BLK1 shown in FIG. 11 is 32 (word lines WL0 to WL31). To nonvolatile memory elements positioned in the same row of the block BLK 1, a word line WL corresponding to this row is connected in common.

Note that a nonvolatile memory element has a similar structure to that MOSFET (Metal Oxide Semiconductor Field Effect Transistor), in which a region which can store electric charges for a long time (charge storing region) is provided over a channel forming region. This charge storing region is also referred to as a floating gate, since the charge storing region is formed over an insulating layer, and insulated to be separated from the surroundings. Over the floating gate, a control gate is provided with an insulating layer interposed therebetween. In a so called floating gate type nonvolatile memory element having such a structure, an operation for injecting charges to the floating gate or an operation for extracting charges from the floating gate is conducted by voltage application to the control gate. In other words, the floating gate type nonvolatile memory element has such a system that charges to be stored in the floating gate is injected or extracted to memorize data. Note that a word line is electrically connected to the control gate.

In FIG. 11, since a selection transistor S1 is connected to the nonvolatile memory elements M0 to M31 in series, these may all be regarded as one set and may be formed using one semiconductor layer 34. In this case, a wiring for connecting the nonvolatile memory element can be omitted for more integration. Further, separation of adjacent NAND cells can be easily conducted. A semiconductor layer 36 of the selection transistor S1 and a semiconductor layer 38 of the NAND cell may be formed to be separated from each other. When the erase operation in which charges are extracted from floating gates of the nonvolatile memory elements M0 to M31 is conducted, the erase operation can be conducted per NAND cell. Further, the nonvolatile memory elements which are connected to one word line (e.g., the row of M30) in common may be formed from one semiconductor layer 40.

Note that the memory cell array is not limited to the above example, for example, a selection transistor S2 may be arranged additionally between the nonvolatile memory element M0 and the source line SL The potential set to a gate electrode of this selection transistor S2 may be a potential for turning on in the same way as when the selection transistor S1 is turned on. For example, it may be equal to the potential set to a gate electrode of the selection transistor S1, in other words, a signal line SG1.

Next, operations of write, erase and read of data are described referring to the NAND cell NS1. The bit line BL, the source line SL, the signal line SG1 and the word line WL are connected to the NAND cell.

Figure 5:
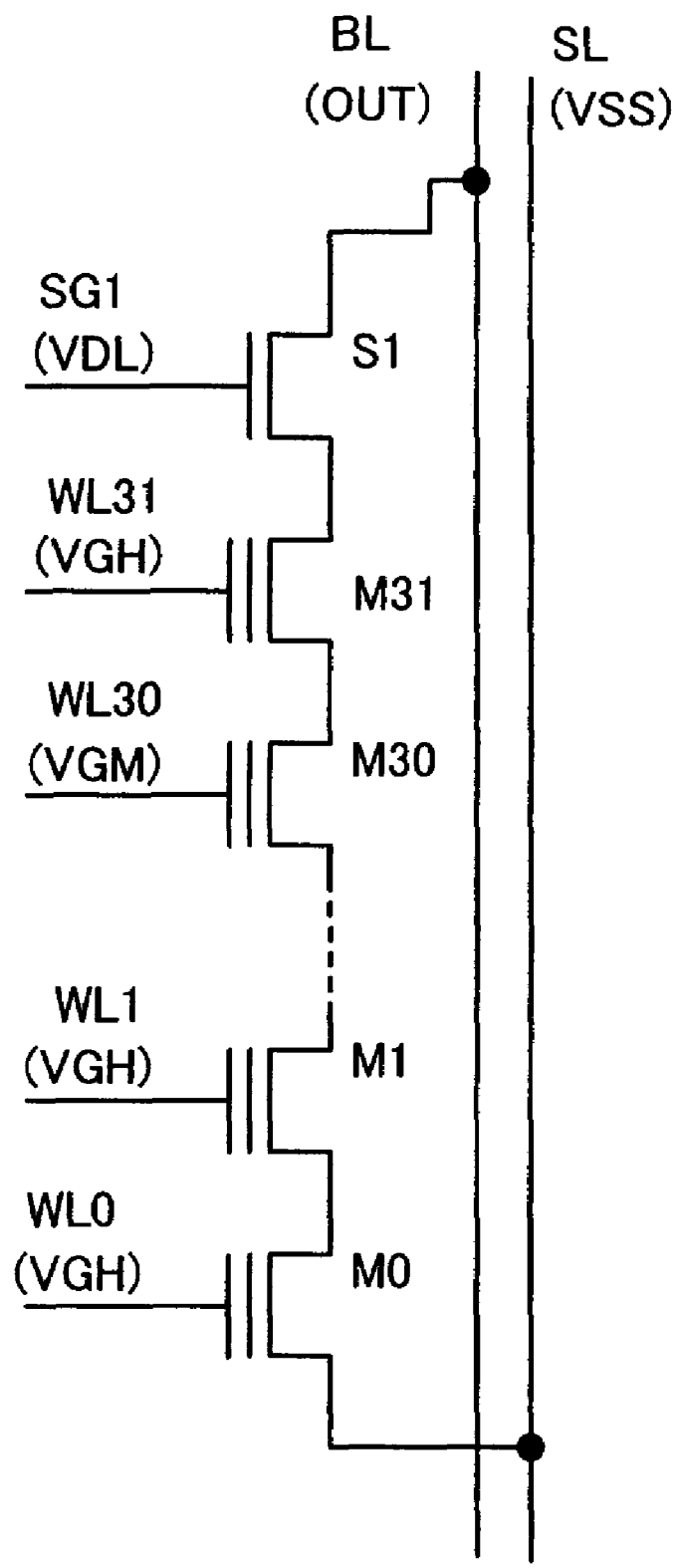
FIG. 5 shows a relation between potentials of control lines when data is read from a nonvolatile memory element M30.

FIG. 5 shows a relation between potentials of control lines when data is read from the nonvolatile memory element M30. Here, an example in which the word line WL30 is selected is described. VGM is set to the selected word line WL30 and a driver circuit low potential source potential (VSS=0V) is set to the source line SL In addition, VGH is set to word lines which are not selected. A driver circuit high potential source potential (VDL) is set to the selection line SG1. Thus, the transistor S1, the nonvolatile memory elements M0 to M29 and M31 are turned on. Whether electrical connection between the bit line BL and the source line SL is done or not depends on data stored in the nonvolatile memory element. In the case of non electrical connection, the potential of the bit line BL is not changed, however, in the case of electrical connection, the potential of the bit line BL decreases. This decrease is detected by the read circuit 906.

Figure 6:
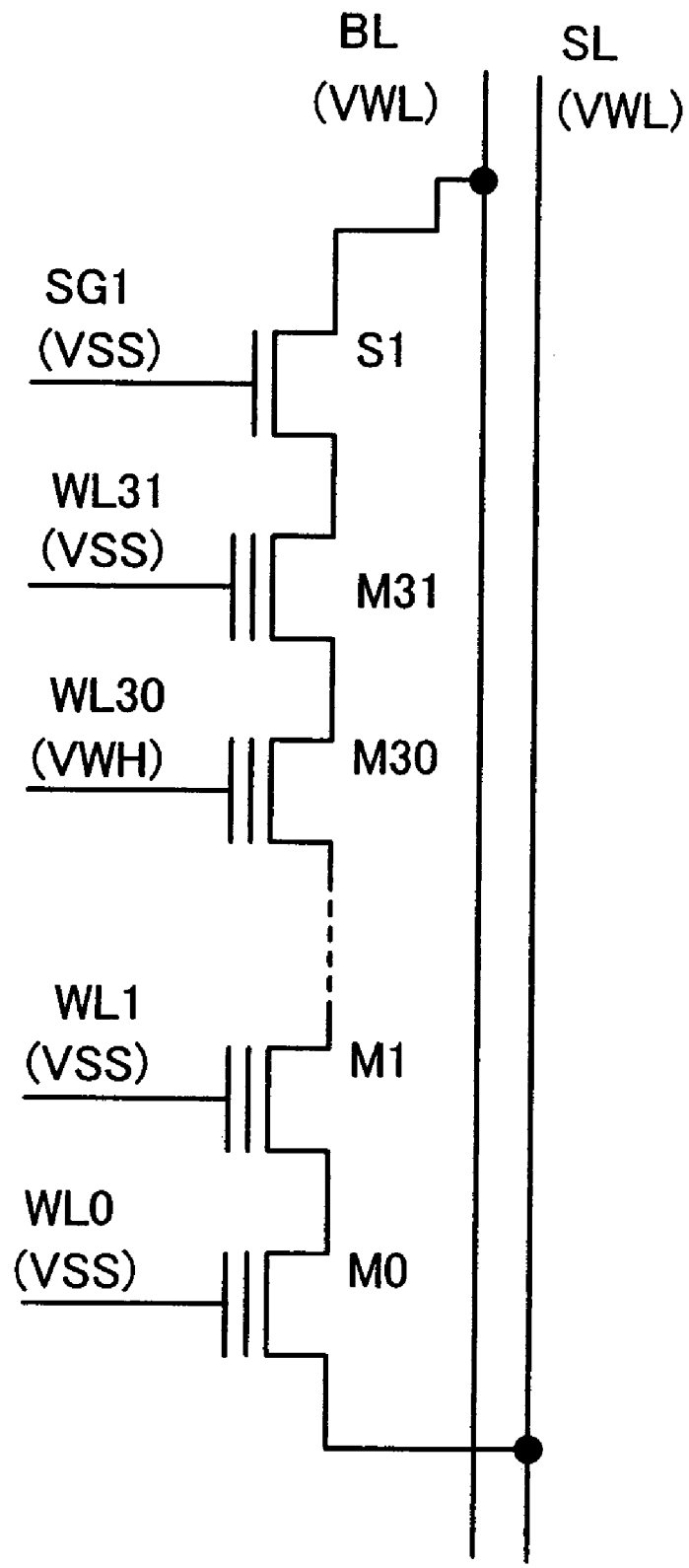
FIG. 6 shows a relation between potentials of control lines when data is written.

FIG. 6 shows a relation between potentials of control lines when electrons are injected to the floating gate, in other words, data is written. In this example, a case where the word line WL30 is selected is described. A high potential for write (VWH) is set to the word line WL30, and a low potential for write (VWL) is set to the bit line BL and the source line SL in a selected column. The selection line SG1 and the word lines which are not selected may be given a potential which makes electrical connection between elements, and in this example, VSS is employed. Thus, the transistor S1, the nonvolatile memory elements M0 to M29 and M31 are turned on. A voltage of VWH-VWL is applied between a control gate and a source or drain terminal of the nonvolatile memory element M30, and the property (threshold voltage) of the nonvolatile memory element is shifted such that the nonvolatile memory element is turned on even when the potential of the word line WL 30 is a potential VGM set at the time of reading data.

Figure 7:
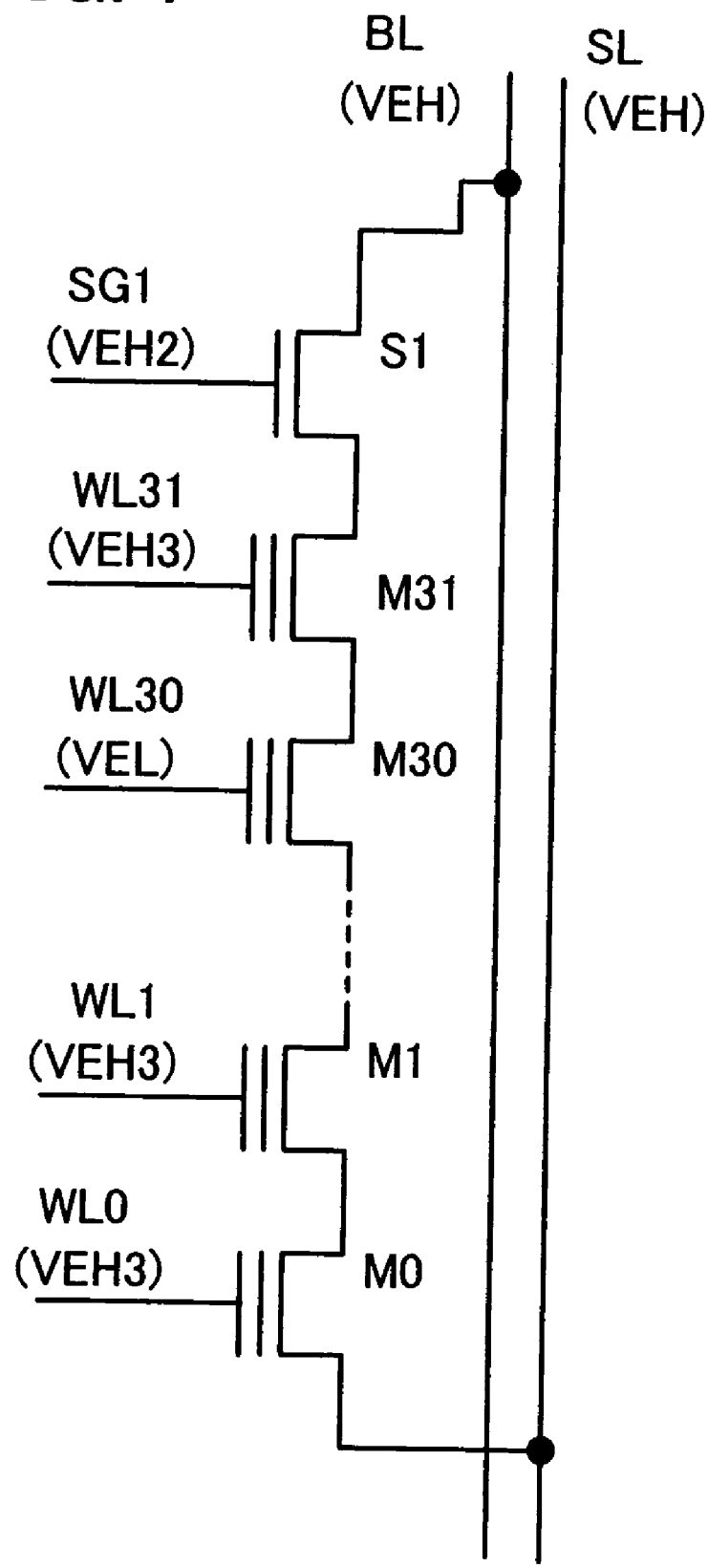
FIG. 7 shows a relation between potentials of control lines when data is erased.

FIG. 7 shows a relation between potentials of control lines when electrons of the floating gate are extracted, in other words, data is erased. Also in this example similarly to the above, a case where the word line WL30 is selected is described. A low potential for erase (VEL) is set to the word line WL30, and a high potential for erase (VEH) is set to the bit line BL and the source line SL in a selected column. The selection line SG1 and the word lines which are not selected may be given a potential which makes electrical connection between elements, and in this example, the potential of the selection line SG1 is a potential (VEH2) which is higher than VEH by the driver circuit high potential source potential (VDL), and the potential of the word lines which are not selected is a potential (VEH3) which is higher than VEH by VGH. Thus, the transistor S1, the nonvolatile memory elements M0 to M29 and M31 are turned on. A voltage of VEL-VEH is applied between the control gate and the source or drain terminal of the nonvolatile memory element M30, and the property (threshold voltage) of the nonvolatile memory element is shifted such that the nonvolatile memory element is turned on when VGH is set, although it is turned off when the potential of the word line WL 30 is VGM.

Figure 8:
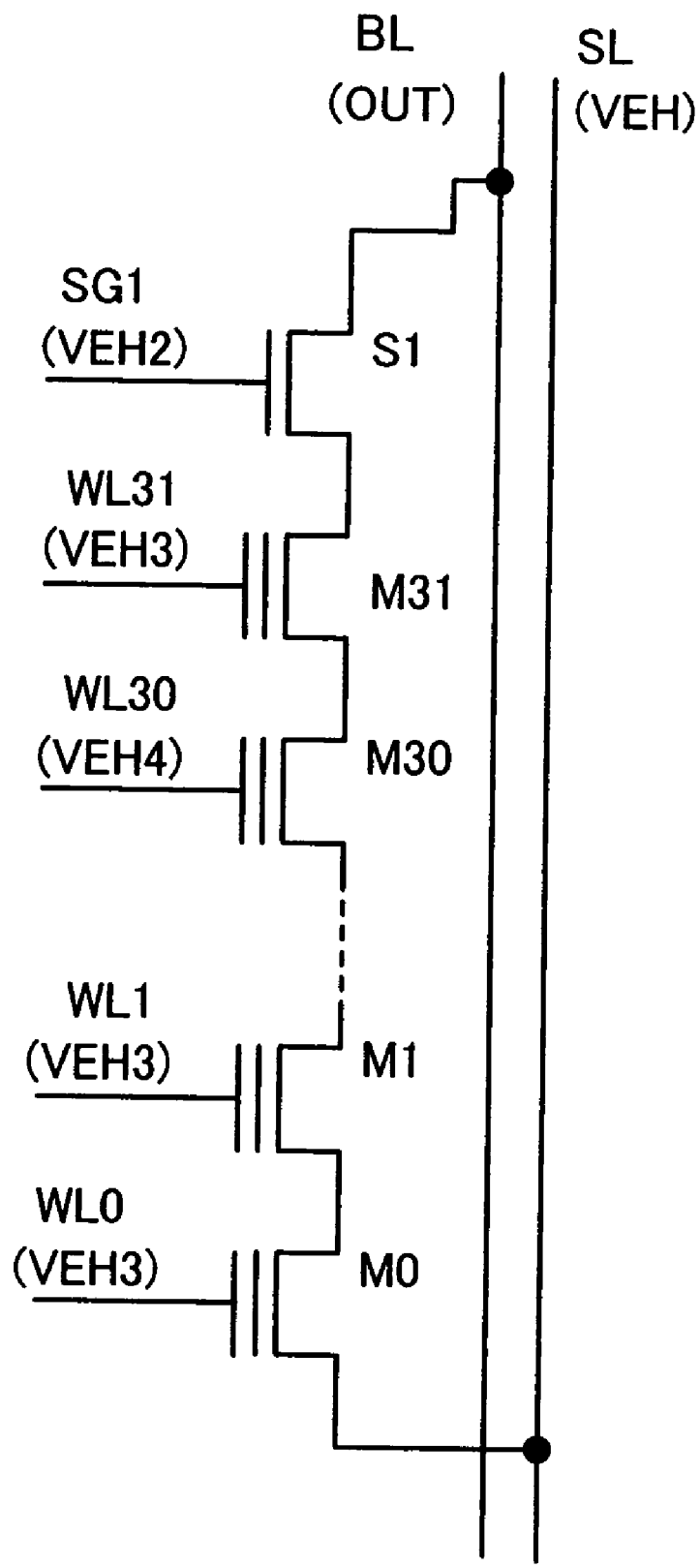
FIG. 8 shows a relation between control lines when data is read in a verify operation for erase.

Next, FIG. 8 shows a relation between potentials of control lines when electrons of the floating gate are extracted, in other words, data is read in a verify operation for erase. Also in this example, a case where the word line WL30 is selected is described. A potential (VEH4) which is higher than VEH by VGM is set to the word line WL30. In addition, a high potential for erase VEH is set to the source line SL. VEH2 which is higher than VEH by VDL is set to the selection line SG1, and VEH3 which is higher than VEH by VGH is set to the word lines which are not selected, of the word lines for controlling the nonvolatile memory elements belonging to the same NAND cell. In this manner, data read from the selected bit line BL is output.

By using the potential at the time of reading data, in other words, the potential as shown in FIG. 5, data is read in the verify operation, and then, in response to the data, data is erased using the potential shown in FIG. 7. To conduct such an operation, it is necessary to change greatly the potentials of the source line, the selection line and the word lines for controlling the nonvolatile memory elements belonging to the same NAND cell. The verify operation like this, in which read and erase are repeated may increase power consumption.

In accordance with the present invention, however, read in the verify operation is conducted using the potentials shown in FIG. 8. FIG. 1 shows the change of potential of each control line in the verify operation for erase. As in the present invention, when the verify operation is conducted using the potential shown in FIG. 8, the potential of only the word line WL30 which is selected may be changed greatly in the verify operation as shown in FIG. 1. Thus, it is possible that the number of control lines of which potentials are to be changed greatly is small according to the present invention.

Figure 10:
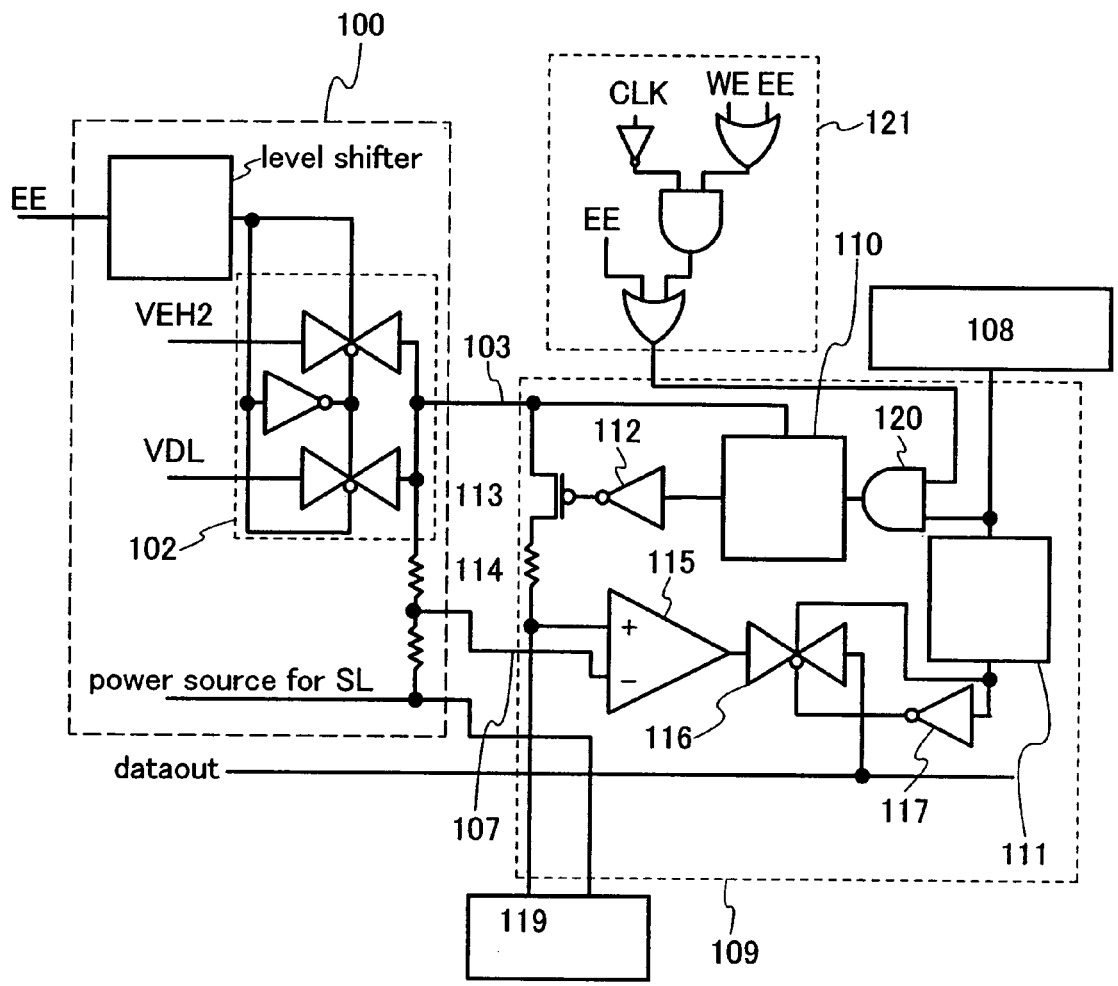
FIG. 10 shows an example of a read circuit.

Next, FIG. 10 shows an example of the read circuit 109. In FIG. 10, a power source controller, a timing generator, a column decoder, and a memory cell are shown together with the read circuit 109. Note that only a portion relating to read is taken out and reference numeral 100 denotes a power source controller; 121, a timing generator; 108, a column decoder; and 119, a memory cell. The read circuit 109 includes level shifters 110 and 111, a sense amplifier 115, a resistor 114, a transistor 113, and logic circuits 112, 116, 117 and 120. A high potential source selection circuit for read 102 is provided for the power source controller 100. In this circuit, the potential of 103 is VEH2 when an erase enable signal is asserted, while it is VDL when the erase enable signal is not asserted. The transistor 113 is turned on when the read operation is conducted and when data written during the verify operation is read for confirmation. At the time of read, in response to data written in the memory cell 119, data is read by detecting that this is higher or lower than the potential of 107 by the sense amplifier 115.

By using such a circuit, the verify operation when the erase enable signal is asserted is repetition of erase and read for confirming written data. At that time, when the potential is controlled as in the present invention, the potential of a selected word line may be shifted between VEL and VEH4.

Therefore, in accordance with the present invention, when erase in the verify operation is conducted, control lines for changing potentials can be reduced to only a selected word line. Accordingly, power consumption can be reduced drastically. Note that as the number of nonvolatile memory elements included in the NAND cell and the capacity of the nonvolatile memory elements are larger, the advantageous effect becomes more remarkable.

In the case of the NAND type nonvolatile memory element, it is necessary to control a threshold voltage of the nonvolatile memory element with more accuracy than in a NOR type, and thus, it is more advantageous to conduct the verify operation in accordance with the present invention. Note that the verify operation is conducted for more accurate control, and the verify operation is especially advantageous for when a potential of a substrate do not exist, e.g., SOI, since it is necessary to write and erase data while controlling potentials of control gates of the surrounding nonvolatile memory elements suitably.

Note that in this embodiment mode, the specific values of voltage are shown, however, the present invention is not limited to the values. As long as a voltage for read in a general operation and a voltage for read in the verify operation are different and power consumption in the read of the verify operation can be reduced, another circuit configuration and another voltage value may be employed.

There is no particular limitation on a bit width for write or read in the structure of this embodiment mode. A combination such as serial write and serial read for each bit; parallel write and parallel read for plural bits; simultaneous read of one row and simultaneous write of one row; or simultaneous read of one row and serial write may be employed.

By the structures and by conducting the write operation as described above, the nonvolatile memory of the present invention can reduce power consumption.

This embodiment mode can be freely combined with the other embodiment modes and embodiment in this specification.

Embodiment Mode 2

Figure 12:
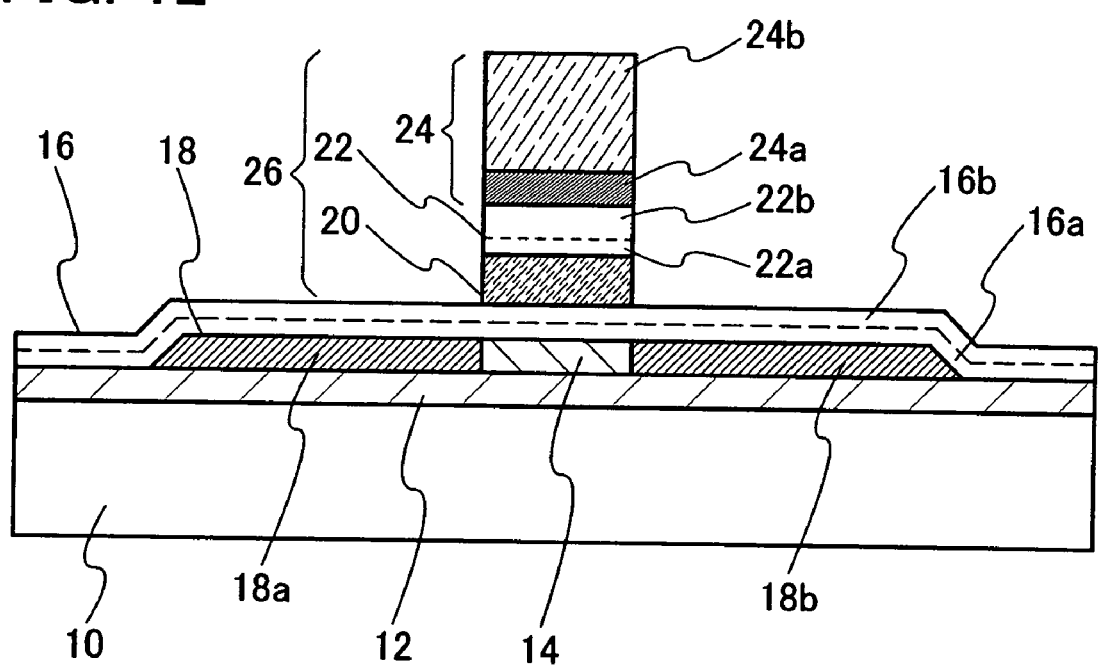
FIG. 12 is a cross sectional view of a nonvolatile memory element shown in Embodiment Mode 2.

Embodiment Mode 2 will describe one structural example of a nonvolatile memory element which can be used for a nonvolatile semiconductor memory device of the present invention with reference to drawings. FIG. 12 is a cross-sectional view of a nonvolatile semiconductor memory element in this embodiment mode. The nonvolatile memory element is formed by using a substrate 10 having an insulating surface. As the substrate 10 having an insulating surface, a glass substrate, a quartz substrate, a sapphire substrate, a ceramic substrate, a metal substrate provided with an insulating layer on the surface, or the like can be used.

A semiconductor film 14 is formed over the substrate 10 having an insulating surface. A base insulating film 12 may be provided between the substrate 10 and the semiconductor film 14. The base insulating film 12 prevents an impurity such as alkali metal from diffusing from the substrate 10 and contaminating the semiconductor film 14. The base insulating film 12 may be provided as a blocking layer as appropriate.

The base insulating film 12 is formed by a CVD method, a sputtering method, or the like using an insulating material such as silicon oxide, silicon nitride, silicon oxynitride ($SiO_xN_y$, (x>y>0)), or silicon nitride oxide ($SiN_xO_y$, (x>y>0)). For example, in the case of forming the base insulating film 12 with a two-layer structure, a silicon nitride oxide film may be formed as a first insulating film, and a silicon oxynitride film may be formed as a second insulating film. Alternatively, a silicon nitride film may be formed as the first insulating film, and a silicon oxide film may be formed as the second insulating film.

The semiconductor film 14 is preferably formed using a single crystal semiconductor or a polycrystalline semiconductor. For example, the semiconductor film 14 can be formed as follows: a semiconductor film is formed over the entire surface of the substrate 10 by a sputtering method, a plasma CVD method, or a low-pressure CVD method, and the semiconductor film is crystallized and selectively etched. In other words, in order to separate elements, it is preferable to form an island-shape semiconductor film over the insulating surface and to form one or a plurality of nonvolatile memory elements using the island-shape semiconductor film. Silicon is preferable as a semiconductor material. Besides, a silicon-germanium semiconductor can also be used. As a crystallization method of the semiconductor film, a laser crystallization method, a crystallization method by a heat treatment using rapid thermal annealing (RTA) or an annealing furnace, a crystallization method using a metal element which promotes crystallization, or a method in which the above methods are combined can be employed. Alternatively, instead of such a thin film formation process, a so-called SOI (Silicon on Insulator) substrate in which a single crystal semiconductor film is formed over an insulating surface may be used.

In such a manner, by separating the semiconductor film formed over the insulating surface into the island-shape semiconductor films, elements can be effectively formed to be separated from each other, also in the case where a memory element array and a peripheral circuit are formed over the same substrate. In other words, also in the case where a memory element array which need perform writing or erasing at a voltage of approximately 10 to 20 V and a peripheral circuit which mainly performs input/output of data or controls an instruction while operating at a voltage of approximately 3 to 7 V are formed over the same substrate, mutual interference due to a difference of voltage applied to each element can be prevented.

In addition, a single crystal silicon substrate (silicon wafer) may be used as the substrate. In that case, when the substrate has an n-type conductivity, a p well to which a p-type impurity element is injected is formed. An upper layer of the p well formed in this manner may be used as the above described semiconductor layer.

A p-type impurity element may be added to the semiconductor film 14. As the p-type impurity element, for example, boron may be added at a concentration of approximately $5 \times 10^{15}$ to $1 \times 10^{16}$ atoms/cm$^3$. This impurity element controls a threshold voltage of a transistor and effectively functions by being added to a channel forming region. The channel forming region is formed in a region which almost corresponds to an lower portion of a gate 26 which will be described afterwards and is positioned between a pair of impurity regions 18 (18a, 18b) of the semiconductor film 14.

The pair of impurity regions 18 functions as a source region and a drain region in the nonvolatile memory element. The pair of impurity regions 18 is formed by addition of phosphorus or arsenic which is an n-type impurity element at a concentration of appropriately $1 \times 10^{19}$ to $1 \times 10^{21}$ atoms/cm$^3$.

Over the semiconductor film 14, a first insulating film 16, a floating gate electrode 20, a second insulating film 22, and a control gate electrode 24 are formed. In this specification, a stacked structure from the floating gate electrode 20 to the control gate electrode 24 may be referred to as the gate 26.

The first insulating film 16 is formed using silicon oxide or a stacked structure of silicon oxide and silicon nitride. The first insulating film 16 may be formed by depositing an insulating film by a plasma CVD method or a low-pressure CVD method, but is preferably formed through solid phase oxidation or solid phase nitridation by a plasma treatment. This is because an insulating film which is formed through oxidation or nitridation of the semiconductor film (typically, a silicon layer) by a plasma treatment has dense film quality, high withstand voltage, and high reliability. The first insulating film 16 is preferably strong since it is used as a tunnel insulating film for injecting charges to the floating gate electrode 20. The first insulating film 16 is preferably formed with a thickness of 1 nm to 20 nm, much preferably 3 nm to 6 nm. For example, in the case where the gate length is to be 600 nm, the first insulating film 16 can be formed with a thickness of 3 nm to 6 nm.

In the solid phase oxidation treatment or solid phase nitridation treatment by the plasma treatment, plasma is preferably used, which is excited by microwaves (typically, 2.45 GHz) and has an electron density of greater than or equal to $1 \times 10^{11}$ cm$^{-3}$ and less than or equal to $1 \times 10^{13}$ cm$^3$ and electron temperatures of greater than or equal to 0.5 eV and less than or equal to 1.5 eV. This is done so that in the solid phase oxidation treatment or solid phase nitridation treatment at temperatures of 500° C. or lower, a dense insulating film is formed and a practical reaction speed is obtained.

When the surface of the semiconductor film 14 is oxidized by the plasma treatment, the plasma treatment is performed in an oxygen atmosphere (for example, an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). Further, when the surface of the semiconductor film 14 is nitrided by the plasma treatment, the plasma treatment is performed in a nitrogen atmosphere (for example, an atmosphere containing nitrogen ($N_2$) and a rare gas (at least one of He, Ne, Ar, Kr, and Xe), an atmosphere containing nitrogen, hydrogen, and a rare gas, or an atmosphere containing NH$_3$ and a rare gas). As the rare gas, Ar can be used, for example. Alternatively, a gas in which Ar and Kr are mixed may also be used.

Figure 13:
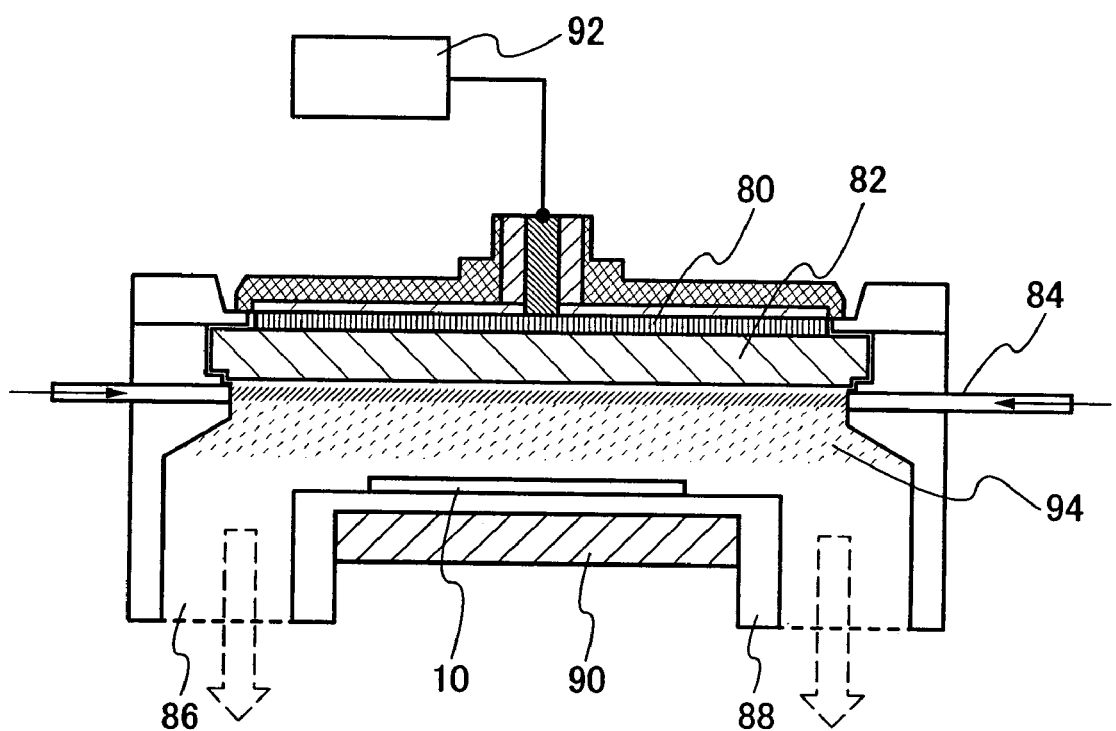
FIG. 13 shows a structure of a plasma treatment apparatus.

FIG. 13 shows a structural example of an apparatus for performing a plasma treatment. The plasma treatment apparatus includes a support 88 on which the substrate 10 is to be arranged, a gas supplying portion 84 for introducing a gas, an exhaust port 86 connected to a vacuum pump for exhausting a gas, an antenna 80, a dielectric plate 82, and a microwave supplying portion 92 which supplies a microwave for plasma generation. In addition, the temperature of the substrate 10 can be controlled by a temperature controlling portion 90 provided for the support 88.

Hereinafter, a plasma treatment will be explained. It is to be noted that the plasma treatment includes an oxidation treatment, a nitridation treatment, an oxynitridation treatment, a hydrogenation treatment, and a surface modification treatment performed to a semiconductor film, an insulating film, and a conductive layer. For these treatments, a gas supplied from the gas supplying portion 84 may be selected in accordance with an intended purpose.

An oxidation treatment or a nitridation treatment may be performed as follows. First, a processing chamber is made in vacuum and a gas containing oxygen or nitrogen for plasma treatment is introduced from the gas supplying portion 84. The substrate 10 is heated at room temperature or at temperatures of 100 to 550° C. by the temperature controlling portion 90. It is to be noted that the distance between the substrate 10 and the dielectric plate 82 is approximately 20 mm to 80 mm (preferably 20 mm to 60 mm). Next, microwaves are supplied from the microwave supplying portion 92 to the antenna 80. Then, the microwaves are introduced from the antenna 80 into the processing chamber through the dielectric plate 82; thus, plasma 94 is generated. When the plasma is excited by the introduced microwaves, plasma which has the low electron temperature (3 eV or lower, preferably 1.5 eV or lower) and the high electron density ($1\times10^{11}$ cm$^{-3}$ or more) can be generated. With oxygen radicals (containing OH radicals in some cases) and/or nitrogen radicals (containing NH radicals in some cases) generated by this high-density plasma, the surface of the semiconductor film can be oxidized or nitrided. A plasma treatment gas mixed with a rare gas such as argon enables oxygen radicals or nitrogen radicals to be generated efficiently due to excited species of a rare gas. In this method, through the effective use of active radicals excited by plasma, oxidation, nitridation, or oxynitridation by a solid phase reaction can be performed at low temperatures of 500° C. or lower.

In FIG. 12, as one preferable example of the first insulating film 16 formed by the plasma treatment, a silicon oxide layer 16a is formed over the semiconductor film 14 with a thickness of 3 nm to 6 nm by performing the plasma treatment in an oxygen atmosphere, and the surface of the silicon oxide layer is treated with a nitridation plasma to form a nitrogen-plasma-treated layer 16b. Specifically, the silicon oxide layer 16a is first formed over the semiconductor film 14 by a plasma treatment in an oxygen atmosphere with a thickness of 3 nm to 6 nm. Then, the nitrogen-plasma-treated layer 16b with high nitrogen concentration is successively provided on the surface of the silicon oxide layer or in the vicinity of the surface through the plasma treatment in nitrogen atmosphere. Note that the expression "the vicinity of the surface" refers to a region in a depth of approximately 0.5 nm to 1.5 nm from the surface of the silicon oxide layer. For example, nitrogen is included at a rate of 20 atomic % to 50 atomic % in a region of the silicon oxide layer 16a in a depth of approximately 1 nm from the surface through a plasma treatment in a nitrogen atmosphere.

In any case, through the use of a solid phase oxidation treatment or a solid phase nitridation treatment by the plasma treatment as described above, an insulating film similar to a thermal oxide film, which is formed at 950° C. to 1050° C., can be obtained even with the use of a glass substrate having a temperature limit of 700° C. or lower. In other words, a highly reliable tunnel insulating film can be formed as the tunnel insulating film of the nonvolatile memory element.

The floating gate electrode 20 is formed over the first insulating film 16. The floating gate electrode 20 is preferably formed using a semiconductor material, and a material which satisfies one or a plurality of the following conditions can be selected.

It is preferable that an energy gap of a semiconductor material forming the floating gate electrode 20 be smaller than that of the semiconductor film 14. For example, it is preferable that an energy gap of a semiconductor material forming the floating gate electrode and an energy gap of the semiconductor film have a difference of 0.1 eV or more, and the former be smaller. This is because an energy level at the conduction band bottom of the floating gate electrode 20 that is lower than that of the semiconductor film 14 can improve injectability of carriers (electrons) and a charge storing property.

The semiconductor material forming the floating gate electrode 20 preferably has lower resistivity than a material forming the semiconductor film 14. When the floating gate electrode 20 is formed of a semiconductor material with low resistivity, a voltage applied between the control gate electrode and the semiconductor film can be prevented from being divided by the floating gate electrode, and an electric field can be made to effectively act on the semiconductor film. For example, germanium is preferable because it has a specific resistance of 40 Ω·cm to 70 Ω·cm. An n-type impurity may be added to the floating gate electrode 20 in order to lower resistivity. For example, write property can be improved when the floating gate electrode 20 is thus formed using a material having a smaller energy gap and a lower resistivity than that of the semiconductor film 14.

As the semiconductor material forming the floating gate electrode 20, such a material that makes the barrier energy for electrons in the floating gate electrode 20, which is formed by the first insulating film 16, higher than barrier energy for electrons in the semiconductor film 14, which is formed by the first insulating film 16, is preferable. This is in order to facilitate carrier (electron) injection from the semiconductor film 14 to the floating gate electrode 20 and prevent charges from going out from the floating gate electrode 20.

Figure 14:
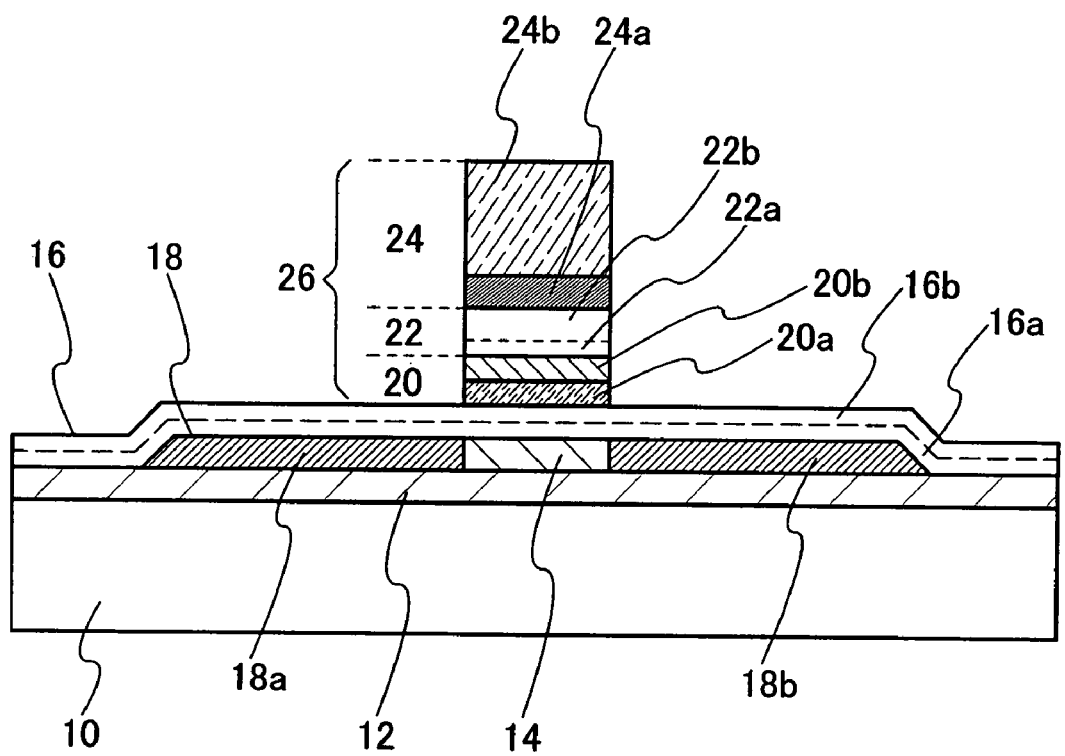
FIG. 14 is a cross sectional view of a nonvolatile memory element shown in Embodiment Mode 2.

The floating gate electrode 20 may be formed from a first floating gate electrode layer 20a and a second floating gate electrode layer 20b as shown in FIG. 14. Of course, the floating gate electrode is not limited to the two-layer structure, and a plurality of layers may be stacked. The first floating gate electrode layer 20a which is formed to be in contact with the first insulating film 16 is preferably formed using a semiconductor material, and a material which satisfies one or a plurality of the conditions shown below can be selected.

It is preferable that an energy gap of a semiconductor material forming the first floating gate electrode layer 20a be smaller than that of the semiconductor film 14. For example, it is preferable that an energy gap of a semiconductor material forming the first floating gate electrode layer 20a and an energy gap of the semiconductor film 14 have a difference of 0.1 eV or more, and the former be smaller. This is because an energy level at the bottom of the conduction band of the first floating gate electrode layer 20a that is lower than that of the semiconductor film 14 can improve injectability of charges (electrons) and a charge storing property.

The semiconductor material forming the first floating gate electrode layer 20a preferably has lower resistivity than a material forming the semiconductor film 14. When the first floating gate electrode layer 20a is formed from a semiconductor material with low resistivity, voltage applied between the control gate electrode and the semiconductor film can be prevented from being divided by the floating gate electrode, and an electric field can be made to effectively act on the semiconductor film. For example, germanium is preferable because it has a specific resistance of 40 $\Omega \cdot$cm to 70 $\Omega \cdot$cm. An n-type impurity element may be added to the first floating gate electrode layer 20a in order to lower resistivity. For example, write property can be improved when the first floating gate electrode layer 20a is thus formed using a material having a smaller energy gap and a lower resistivity than that of the semiconductor film 14.

As the semiconductor material forming the first floating gate electrode layer 20a, such a material that makes barrier energy for electrons in the first floating gate electrode layer 20a, which is caused by the first insulating film 16, higher than barrier energy for electrons in the semiconductor film 14, which is caused by the first insulating film 16, is preferable. This is because charges (electrons) are easily injected from the semiconductor film 14 to the first floating gate electrode layer 20a and charges can be prevented from going out from the first floating gate electrode layer 20a.

Semiconductor materials for forming the floating gate electrode 20 shown in FIG. 12 or the first floating gate electrode layer 20a shown in FIG. 14 may be germanium or a germanium compound, typically. Silicon germanium is given as a typical germanium compound. In this case, preferably, 10 atomic % or more of germanium is contained in silicon. With the concentration of germanium of less than 10 atomic %, effect as a constituent element is weakened, and an energy gap does not get smaller effectively.

The floating gate (hereinafter, also referred to as a charge accumulating layer) is applied to a nonvolatile semiconductor memory device of the present invention in order to accumulate charges. Of course, other materials can also be employed to form the floating gate as long as they have similar effects. For example, a ternary semiconductor material containing germanium may be used. In addition, the semiconductor material may be hydrogenated. In addition, as a floating gate electrode having a function as a charge accumulating layer of the nonvolatile memory element, a layer of an oxide or a nitride of germanium or a germanium compound can be used instead.

As the second floating gate electrode 20b which is provided on the second insulating film 22 side to be in contact with the first floating gate electrode layer 20a in FIG. 14, a layer formed using silicon or a silicon compound is preferably used. As a silicon compound, silicon nitride, silicon nitride oxide, silicon carbide, silicon germanium containing germanium at a concentration of less than 10 atomic %, metal nitride, metal oxide, or the like can be employed. In such a manner, the second floating gate electrode layer 20b that is formed using a material with a larger energy gap than that of the first floating gate electrode layer 20a can prevent charges accumulated in the floating gate from leaking to the second insulating film 22 side. In addition, as a material for the second floating gate electrode layer 20b, metal nitride, metal oxide or the like can be used. As the metal nitride, tantalum nitride, tungsten nitride, molybdenum nitride, titanium nitride, or the like can be used. As the metal oxide, tantalum oxide, titanium oxide, tin oxide, or the like can be used.

In any case, in FIG. 14, when the second floating gate electrode layer 20b formed from silicon, a silicon compound, metal nitride or metal oxide as described above is provided on the upper layer side of the first floating gate electrode layer 20a formed using germanium or a germanium compound, the second floating gate electrode layer can be used as a barrier layer for water proof or chemical resistance in the manufacturing process. Therefore, the substrate can be easily handled in a photolithography process, an etching process, or a cleaning process, and thus, productivity can be improved. In other words, the floating gate can be easily processed.

The second insulating film 22 provided over the second floating gate electrode layer 20b is formed by a low-pressure CVD method, a plasma CVD method, or the like using one or a plurality of layers of silicon oxide, silicon oxynitride (SiOxNy, (x>y)), silicon nitride (SiNx), silicon nitride oxide (SiNxOy, (x>y)), aluminum oxide (AlxOy), and the like. The second insulating film 22 is formed with a thickness of 1 nm to 20 nm, preferably 5 nm to 10 nm. For example, an insulating film in which a silicon nitride layer 22a is deposited with a thickness of 3 nm, and a silicon oxide layer 22b is deposited thereover with a thickness of 5 nm, can be used. In addition, the floating gate electrode 20 may be subjected to a plasma treatment, and thus, a nitride film which is formed by nitriding the surface of the floating gate electrode layer 20 (for example, germanium nitride, in the case where germanium is used as the floating gate electrode 20) may be formed. In any case, when one or both of the sides in which the first insulating film 16 and the second insulating film 22 are contact with the floating gate electrode 20, is/are a nitride film or a layer subjected to a nitridation treatment, the floating gate electrode 20 can be prevented from being oxidized. Furthermore, a high-k material such as hafnium oxide (HfOx) or tantalum oxide (TaOx) can be used as the second insulating film 22.

The control gate electrode 24 is preferably formed using a metal selected from among tantalum (Ta), tungsten (W), titanium (Ti), molybdenum (Mo), chromium (Cr), and niobium (Nb), or an alloy material or a compound material containing the metal as its main component. In addition, polycrystalline silicon to which an impurity element such as phosphorus is added can be used. Alternatively, the control gate electrode 24 may be formed using a stacked structure including one or a plurality of layers, such as a metal nitride layer 24a and a metal layer 24b formed using the above metal. As the metal nitride, tungsten nitride, molybdenum nitride, or titanium nitride can be used. By providing the metal nitride layer 24a, adhesion of the metal layer 24b can be improved; therefore, the metal layer 24b can be prevented from peeling. In addition, since a metal nitride such as tantalum nitride has a high work function, the thickness of the first insulating film 16 can be thick.

An operation mechanism of the nonvolatile memory element shown in FIG. 12 will be explained with reference to a band diagram of FIG. 15. An operation mechanism of the nonvolatile memory element shown in FIG. 14 will be explained with reference to a band diagram of FIG. 16. In the following band diagrams, the same portions as those in FIG. 12 and FIG. 15 are denoted by the same reference numerals.

Figure 15:
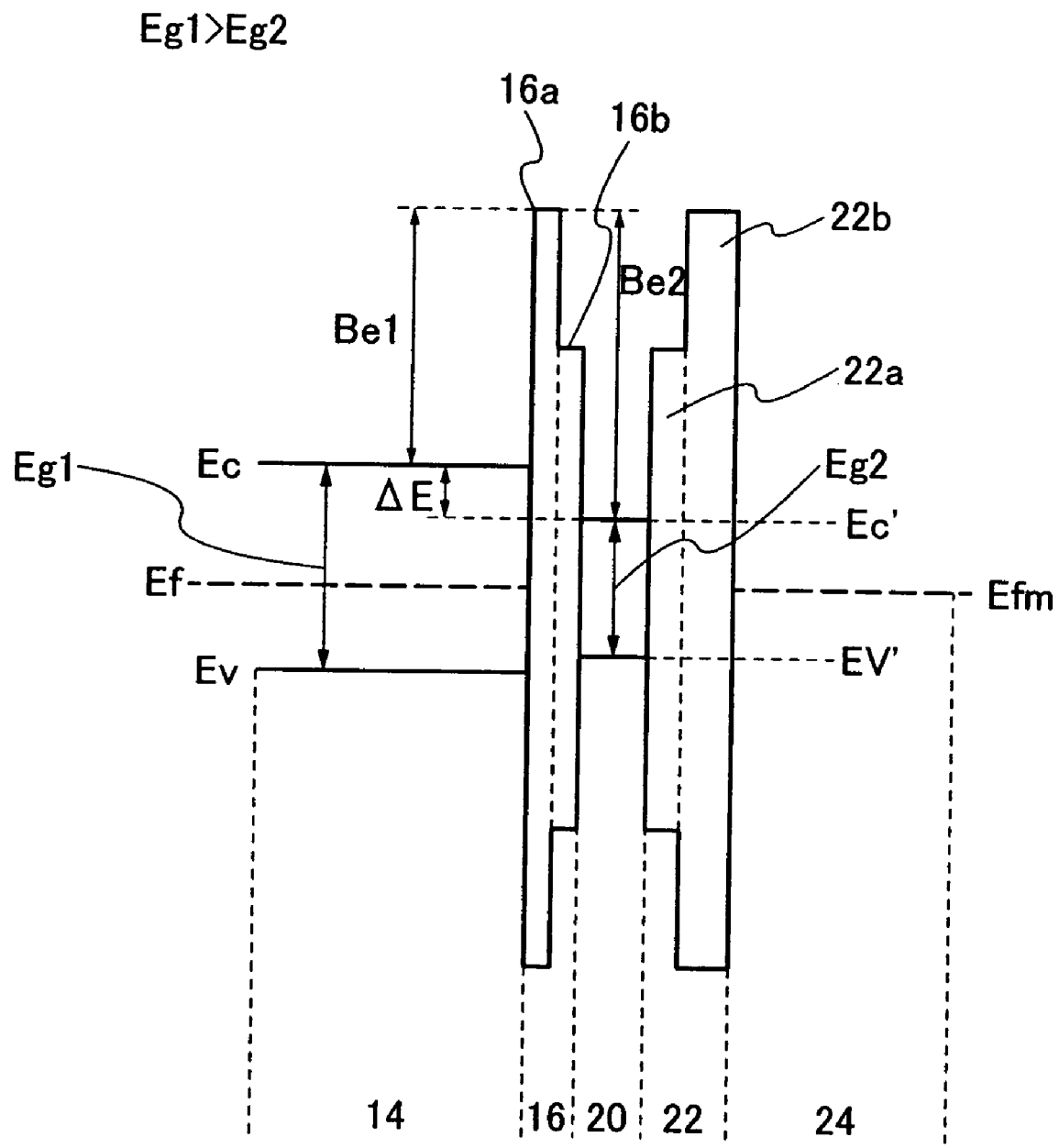
FIG. 15 is a band diagram of a nonvolatile memory element.

FIG. 15 shows a state where the semiconductor film 14, the first insulating film 16, the floating gate electrode 20, the second insulating film 22, and the control gate electrode 24 are stacked. FIG. 15 shows the case where a voltage is not applied to the control gate electrode 24, and a Fermi level Ef of the semiconductor film 14 and a Fermi level Efm of the control gate electrode 24 are equal.

The semiconductor film 14 and the floating gate electrode 20 are formed using different materials, with the first insulating film 16 interposed therebetween. An energy gap Eg1 (the energy difference between the bottom level Ec of the conduction band and the top level Ev of the valence band) of the semiconductor film 14 and an energy gap Eg2 of the floating gate electrode 20 are to be different, and the floating gate electrode 20 has a smaller energy gap than that of the semiconductor film 14. For example, silicon (1.12 eV) can be used for the semiconductor film 14, whereas germanium (0.72 eV) or silicon germanium (0.73 to 1.0 eV) can be used for the floating gate electrode 20. Germanium or silicon germanium may be hydrogenated. At that time, the content of hydrogen in germanium or silicon germanium may be 1 to 30 atomic %. The first floating gate electrode layer 20a is formed using germanium containing hydrogen, and the number of recombination centers at the interface between the first floating gate electrode layer 20a and the first insulating film 16 can be reduced.

When a vacuum level is to be 0 eV, an energy level of the conduction band of silicon is −4.05 eV and an energy level of the conduction band of germanium is −4.1 eV. Further, an energy level of the conduction band of silicon oxide is −0.9 eV. Therefore, such a combination of the semiconductor film 14 and the first floating gate electrode layer 20a can enhance barrier energy (Be2) to electrons in the first floating gate electrode layer 20a, which is caused by the first insulating film 16, with respect to barrier energy (Be1) to electrons in the semiconductor film 14, which is caused by the first insulating film 16. In other words, the barrier energy for the electrons, that is, the first barrier Be1 and the second barrier Be2 have different values and can have a relation of Be2>Be1.

Figure 16:
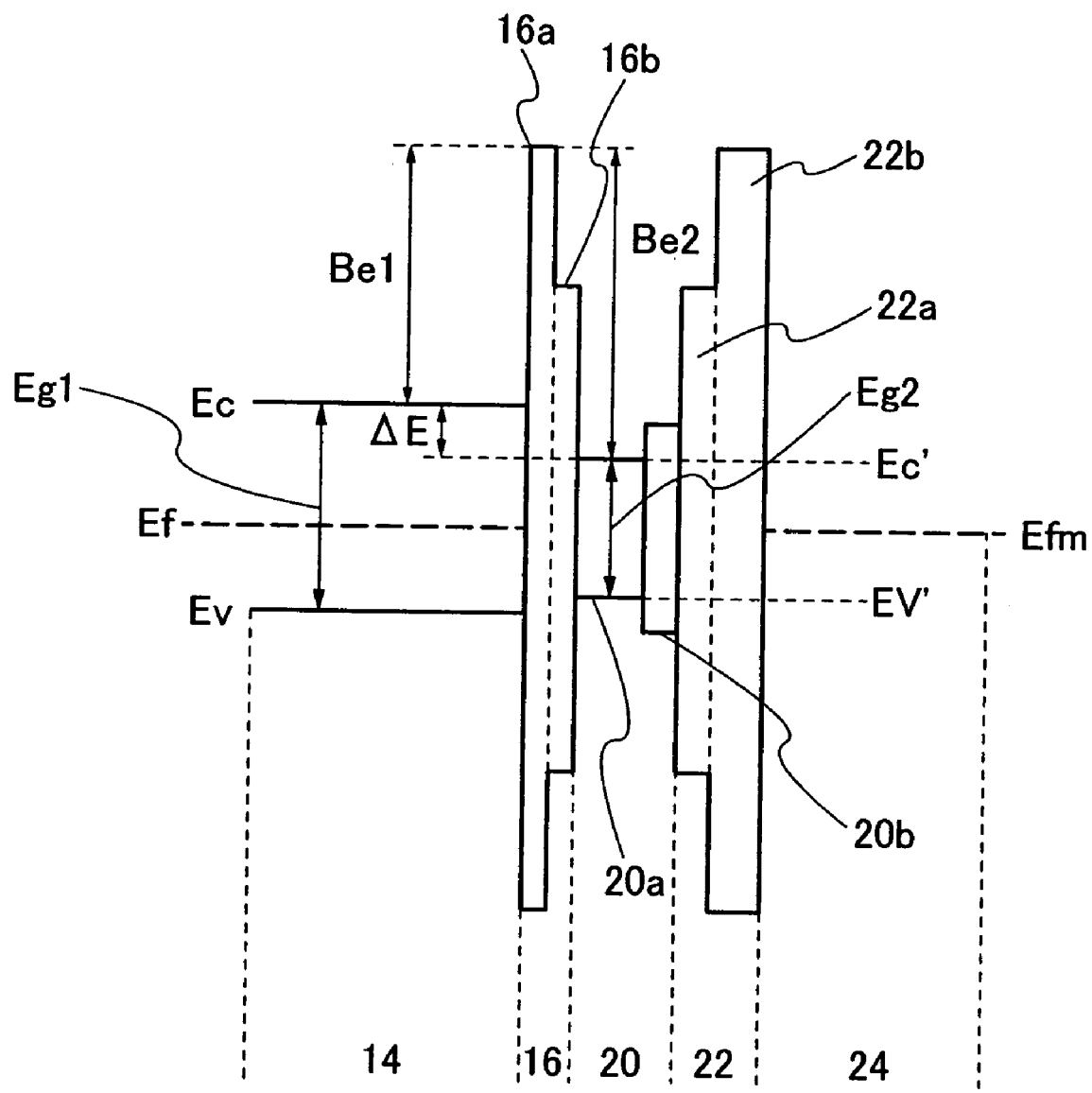
FIG. 16 is a band diagram of a nonvolatile memory element.

FIG. 16 shows a state in which the semiconductor film 14, the first insulating film 16, the floating gate 20, the second insulating film 22, and the control gate 24 are stacked. FIG. 16 shows the case where no voltage is applied to the control gate 24 and the Fermi level Ef of the semiconductor film 14 is equal to the Fermi level Efm of the control gate electrode 24.

The semiconductor film 14 and at least the first floating gate electrode layer 20a of the floating gate electrode 20 are formed from different materials, with the first insulating film 16 interposed therebetween. The energy gap Eg1 (the energy difference between the bottom level Ec of the conduction band and the top level Ev of the valence band) of the semiconductor film 14 is made different from the energy gap Eg2 of the first floating gate electrode layer 20a, and the energy gap Eg2 is made smaller the energy gap Eg1. For example, silicon (1.12 eV) may be used for the semiconductor film 14 and germanium (0.72 eV) or silicon germanium (0.73 to 1.0 eV) may be used for the first floating gate electrode layer 20a. In the case where polysilicon is used for the second floating gate electrode layer 20b, the energy gap of the second floating gate electrode layer 20b is larger than that of the first floating gate electrode layer 20a. This difference in energy gap functions as a barrier against carriers which are injected into the first floating gate electrode layer 20a through the first insulating film 16. Accordingly, the injected carriers can be prevented from leaking to the side of the second insulating film 22 and also prevented from being trapped at the interface between the second floating gate electrode layer 20b and the second insulating film 22.

Note that the first insulating film 16 is shown in the state that the silicon oxide layer 16a (about 8 eV) and the nitrogen-plasma-treated layer 16b (about 5 eV) which is obtained by nitriding the surface of the silicon oxide layer by a plasma treatment are stacked. In addition, the second insulating film 22 is also shown in the state that the silicon nitride layer 22a and the silicon oxide layer 22b are stacked over the floating gate 20.

The semiconductor film 14 and the first floating gate electrode layer 20a are formed from different materials, with the first insulating film 16 interposed therebetween. In this case, the energy gap of the semiconductor film 14 is different from the energy gap of the first floating gate electrode layer 20a, and they are combined such that the energy gap of the first floating gate electrode layer 20a is smaller. For example, silicon (1.12 eV) may be used for the semiconductor film 14 and germanium (0.72 eV) or silicon germanium (0.73 to 1.1 eV) may be used for the first floating gate electrode layer 20a. That is, the energy gap Eg1 of silicon of the semiconductor film 14 and the energy gap Eg2 of germanium of the first floating gate electrode layer 20a satisfy the relation of Eg1>Eg2. The energy barriers for electrons which are caused by the first insulating film 16, of the semiconductor film 14 and the first floating gate electrode layer 20a, i.e., the first barrier Be1 and the second barrier Be2, have different values, and can satisfy the relation of Be2>Be1. In such conditions, there arises an energy difference of $\Delta E$ between the bottom energy levels of the conduction bands of the semiconductor film 14 and the first floating gate electrode layer 20a. This energy difference $\Delta E$ acts in the direction in which electrons which have been injected from the semiconductor film 14 into the floating gate electrode 20 are accelerated, which will be described later. Therefore, the energy difference $\Delta E$ can contribute to lowering the writing voltage.

Figure 17:
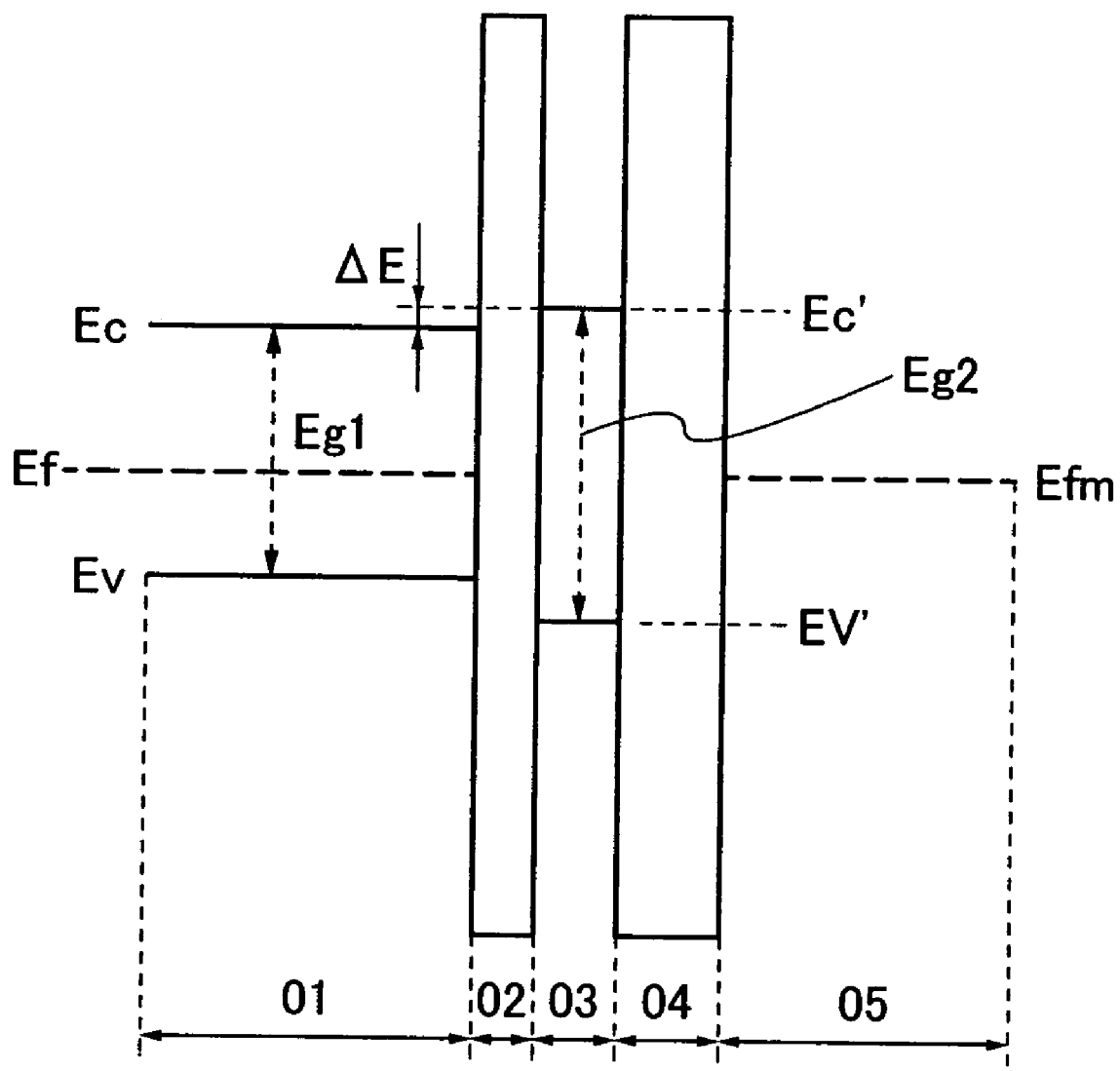
FIG. 17 is a band diagram of a conventional nonvolatile memory element.

For comparison, FIG. 17 shows a band diagram where a semiconductor film and a floating gate electrode are formed using the same semiconductor material. This band diagram shows a state where a semiconductor film 01, a first insulating film 02, a floating gate electrode 03, a second insulating film 04, and a control gate electrode 05 are sequentially stacked. Also when the semiconductor film 01 and the floating gate electrode 03 are formed using the same silicon material, energy gaps thereof are different when the floating gate electrode 03 is formed thinly. In FIG. 17, an energy gap of the semiconductor film 01 is denoted by Eg1, and an energy gap of the floating gate electrode 03 is denoted by Eg2. For example, an energy gap of silicon is increased to approximately 1.4 eV from 1.12 eV that is a value of a bulk state by being formed into a thin film. Accordingly, an energy difference of $-\Delta E$ is generated between the semiconductor film 01 and the floating gate electrode 03 in a direction which blocks electron injection. In such a condition, high voltage is necessary for injection of electrons from the semiconductor film 01 to the floating gate electrode 03. In other words, in order to reduce writing voltage, it is necessary to form the floating gate electrode 03 as thick as bulk silicon, or add phosphorus or arsenic as an n-type impurity element at a high concentration. This is a defect in a conventional nonvolatile memory.

For electron injection to the floating gate electrode 20, there are a method utilizing thermoelectrons and a method utilizing F-N (Fowler-Nordheim) type tunnel current. In this embodiment mode, electrons are injected to the floating gate electrode 20 by utilizing F-N type tunnel current. In the case of the method utilizing F-N type tunnel current, positive voltage is applied to the control gate electrode 24, and electrons are injected from the semiconductor film 14 to the floating gate electrode 20 by F-N type tunnel current.

Figure 18A:
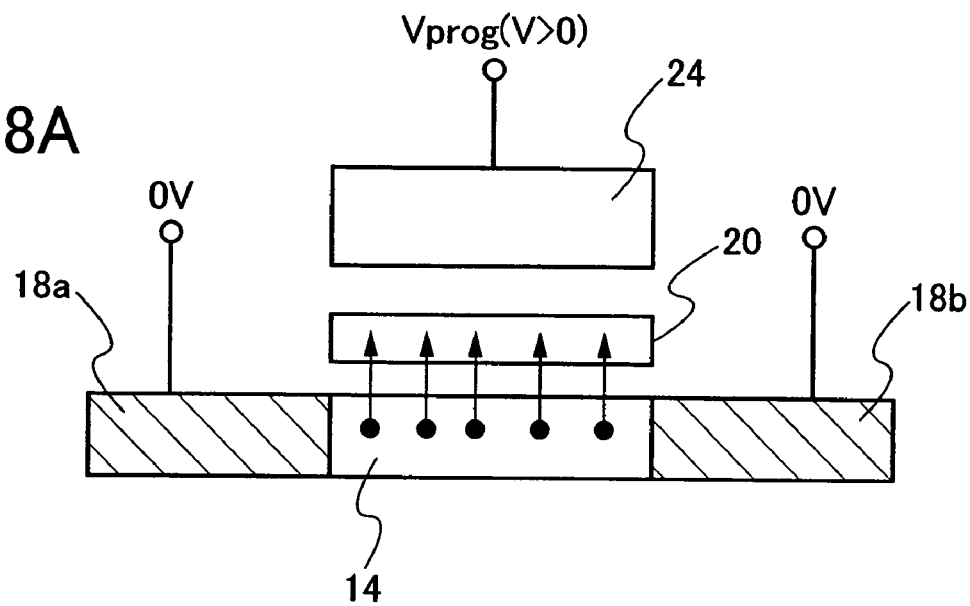
FIGS. 18A and 18B show write and read operations of a nonvolatile memory element.
Figure 19:
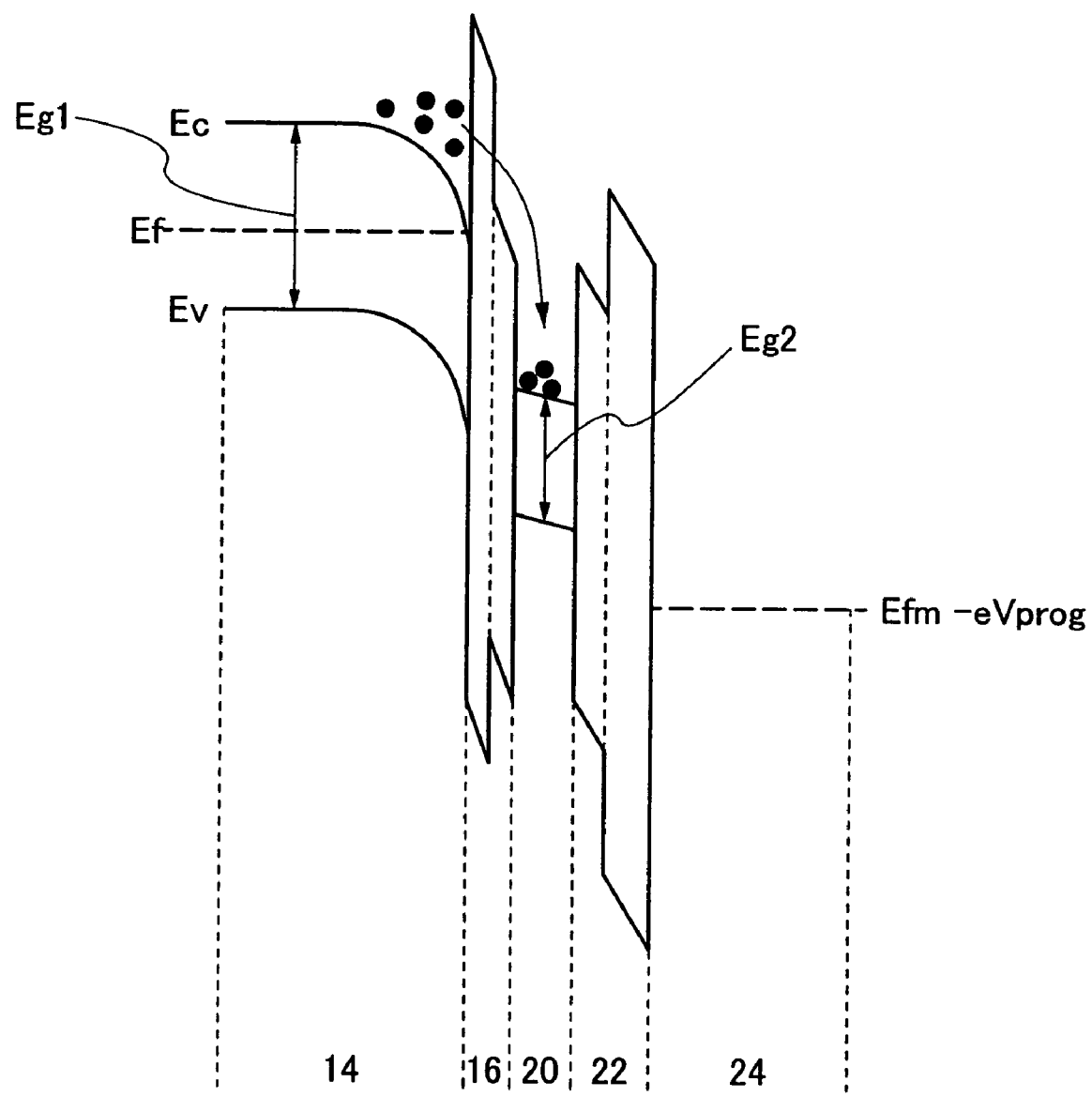
FIG. 19 is a band diagram of a nonvolatile memory element when data is written.

FIG. 18A shows applied voltage when electrons are injected to the floating gate electrode 20 by F-N type tunnel current. High positive voltage (10 to 20 V) is applied to the control gate electrode 24 while the source region 18a and the drain region 18b are set at 0V. FIG. 19 shows a band diagram at this time. A high electric filed enables electrons of the semiconductor film 14 to be injected to the floating gate 20 through the first insulating film 16; therefore, F-N type tunnel current flows. As explained in FIGS. 15 and 16, a relation between the energy gap Eg1 of the semiconductor film 14 and the energy gap Eg2 of the floating gate electrode 20 is Eg1>Eg2. This difference acts as self-bias, so that electrons injected from the channel forming region of the semiconductor film 14 are accelerated toward the floating gate electrode. Accordingly, injectability of electrons can be improved.

An energy level at the bottom of the conduction band of the floating gate electrode 20 lies at a level that is lower than the energy level at the bottom of the conduction band of the semiconductor film 14 by ΔE in terms of electron energy. Therefore, when electrons are injected to the floating gate electrode 20, an internal electric field generated by this energy difference acts. This phenomenon is realized by a combination of the semiconductor film 14 and the floating gate electrode 20 as described above. In other words, electrons can be easily injected from the semiconductor film 14 to the floating gate electrode 20, and thus, a write property in the nonvolatile memory element can be improved. This effect is obtained also when electrons are injected to the floating gate electrode 20 with the use of thermoelectrons.

Figure 20:
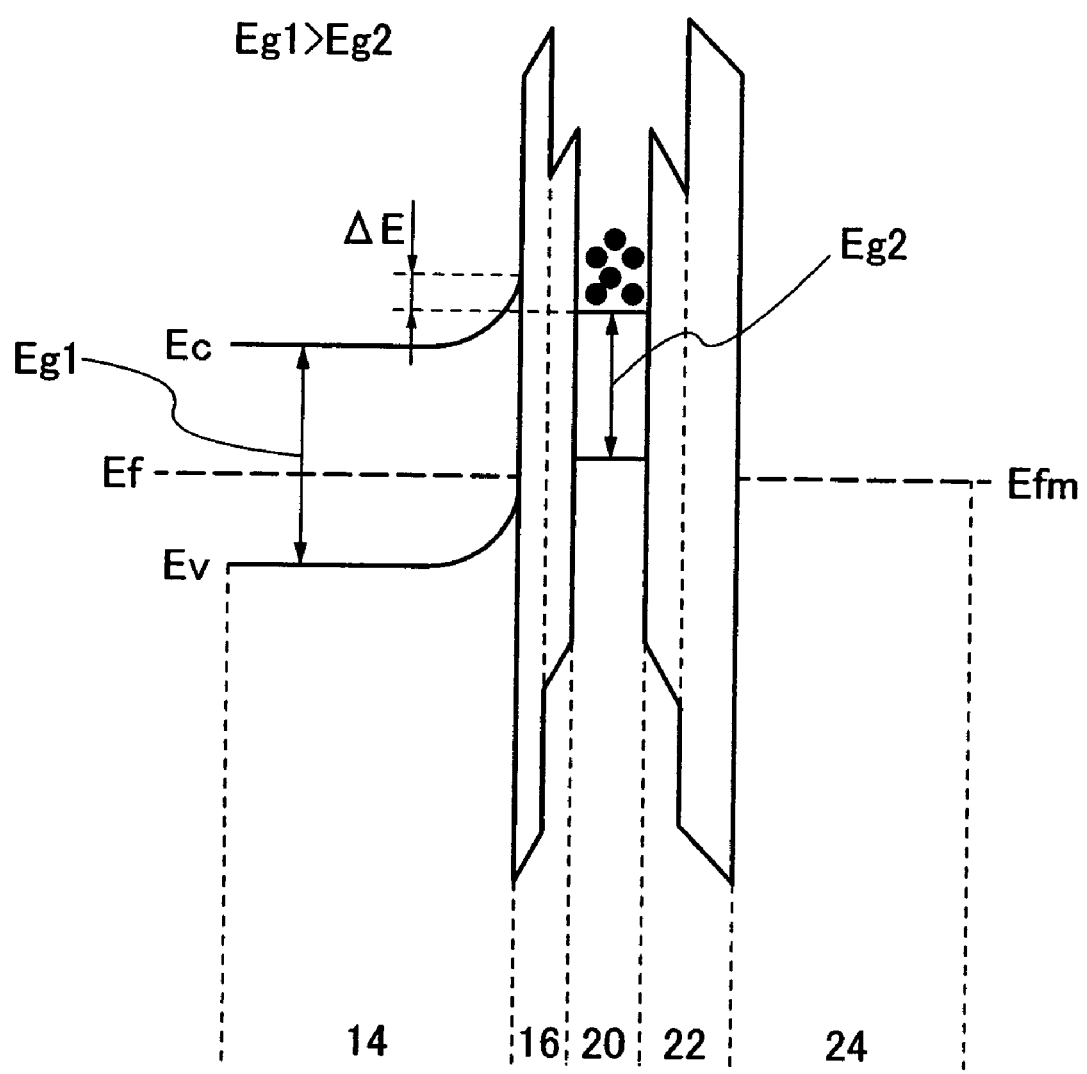
FIG. 20 is a band diagram of a nonvolatile memory element when charges are stored.

During storing electrons in the floating gate electrode 20, the threshold voltage of the nonvolatile memory element is shifted to a positive direction. This state can be regarded as a state where data "0" is written. FIG. 20 shows a band diagram of a charge-storing state. Electrons of the floating gate electrode 20 are stored in terms of energy by being interposed between the first insulating film 16 and the second insulating film 22. This means that, although potential is increased by carriers (electrons) accumulated in the floating gate electrode 20, electrons are not discharged from the floating gate electrode 20 unless energy over barrier energy is given to the electrons. The energy level at the bottom of the conduction band of the floating gate electrode 20 lies at a level that is lower than the energy level at the bottom of the conduction band of the semiconductor film 14 by ΔE in terms of electron energy, and the energy barrier is formed to electrons. By this barrier, electrons can be prevented from being discharged to the semiconductor film 14 by tunnel current. In other words, carriers accumulated in the floating gate electrode can be retained also in a reliability test in which the device is left at a constant temperature of 150° C.

Figure 18B:
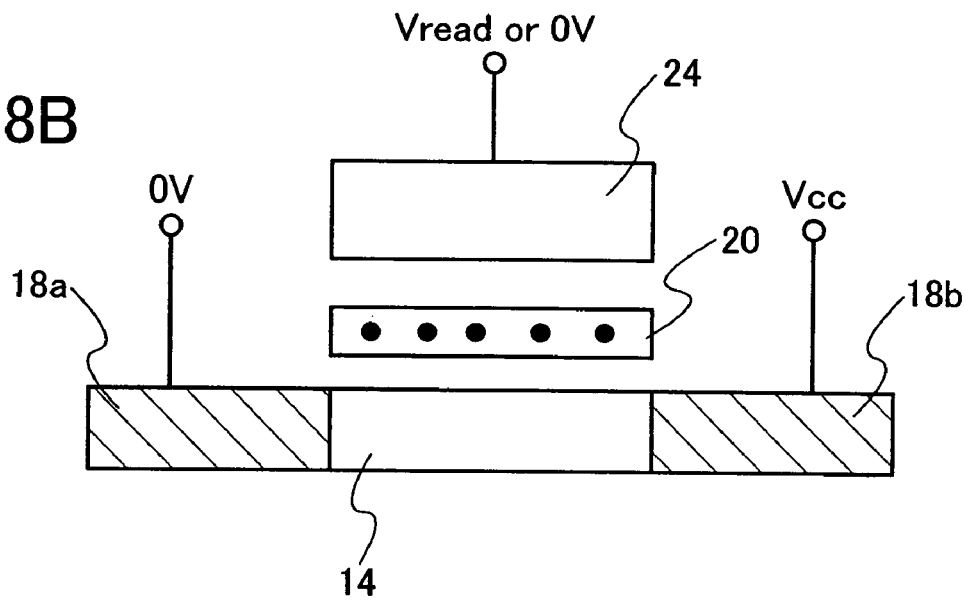

A state where data "0" is written is detected as follows: it is detected by a circuit that a transistor is not turned on when an intermediate potential Vread is set to the control gate electrode 24. The intermediate potential is a potential corresponding to a voltage between the threshold Voltage Vth1 in data "1" and the threshold voltage Vth2 in the data "0" (in this case, Vth1<Vread<Vth2). Alternatively, the state where data "0" is written can be detected depending on whether the nonvolatile memory element is conducted by application of a bias voltage to the source region 18*a* and the drain region 18*b* so that the control gate electrode 24 is set at 0 V as shown in FIG. 18B.

Figure 21A:
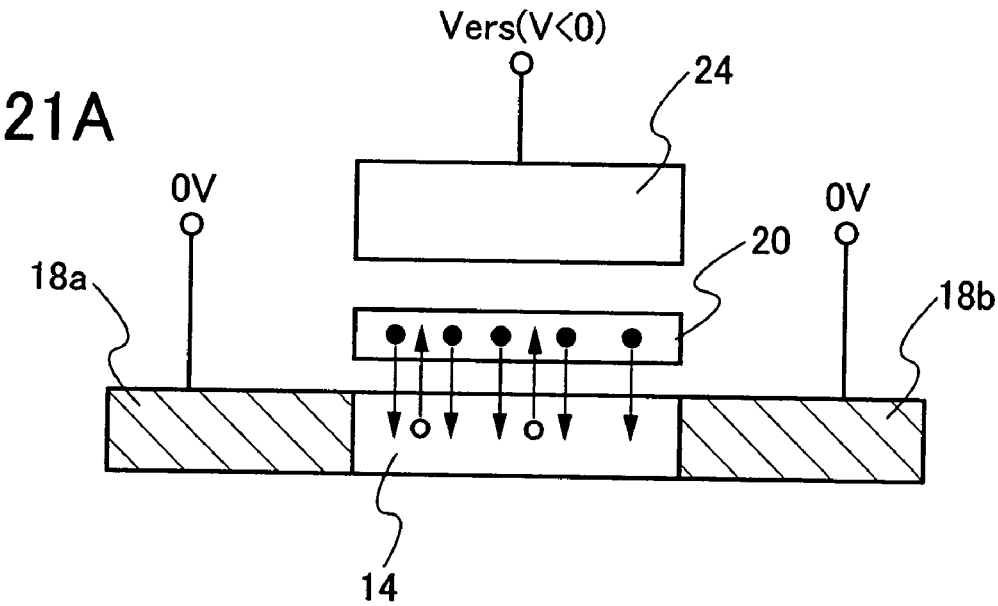
FIGS. 21A and 21B show an erase operation of a nonvolatile memory element.
Figure 21B:
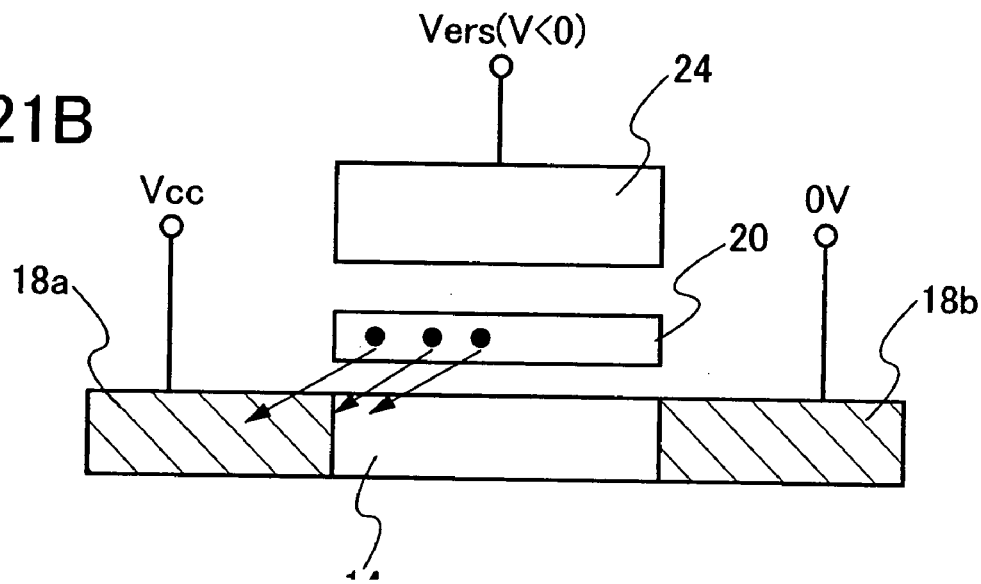

FIG. 21A shows a state where charges are discharged from the floating gate electrode 20 and data is erased from the nonvolatile memory element. In this case, a negative bias voltage is applied to the control gate electrode 24, and F-N type tunnel current is flowed between the semiconductor film 14 and the floating gate electrode 20, whereby data is erased. Alternatively, as shown in FIG. 21B, a negative bias voltage may be applied to the control gate electrode 24, and a high positive voltage may be applied to the source region 18*a* so that F-N type tunnel current is generated and electrons may be extracted to the source region 18*a* side.

Figure 22:
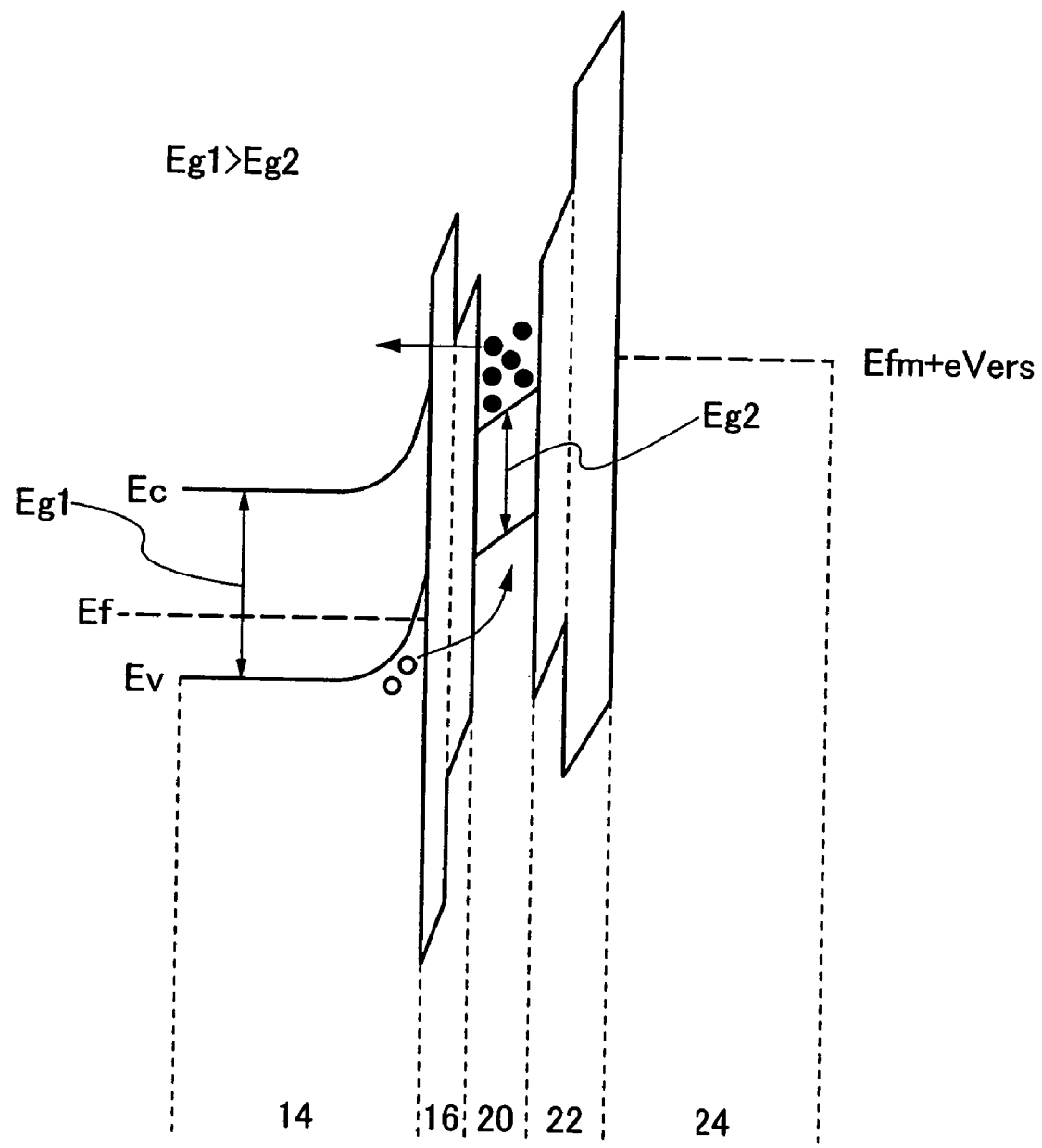
FIG. 22 is a band diagram of a nonvolatile memory element when data is erased.

FIG. 22 shows a band diagram in the erase state. Since the first insulating film 16 are formed thin, electrons of the floating gate electrode 20 can be discharged to the semiconductor film 14 side by F-N type tunnel current in the erase operation. In addition, holes can be easily injected from the channel forming region of the semiconductor film 14. Therefore, a substantial erase operation can be achieved by injection of holes to the floating gate electrode 20.

When the floating gate electrode 20 is formed using germanium or a germanium compound, the thickness of the first insulating film 16 can be thin. Accordingly, electrons can be easily injected to the floating gate electrode 20 through the first insulating film 16 by tunnel current, and thus, a low-voltage operation becomes possible. Further, since charges can be stored at a low energy level, an advantageous effect that charges can be stored stably can be obtained.

The nonvolatile memory element according to the present invention has a structure as shown in FIGS. 15, 16 and 19 such that self-bias as Eg1>Eg2 is generated between the semiconductor film 14 and the floating gate electrode 20. This relation is highly important and enables carriers to be easily injected from the channel forming region of the semiconductor film to the floating gate electrode. That is, writing voltage can be reduced, and thus, carriers are not easily discharged from the floating gate electrode. This can improve a memory storing property of the nonvolatile memory element. In addition, a germanium layer as the floating gate electrode is doped with an n-type impurity element, thus, self-bias can act so that an energy level at the bottom of the conduction band can be further lowered, and carriers can be more easily injected to the floating gate electrode. In other words, writing voltage can be reduced, and a memory storing property of the nonvolatile memory element can be improved. Note that the nonvolatile memory element using a single layer of the floating gate electrode 20 is described, however, the same can be applied to the nonvolatile memory element shown in FIG. 14.

As explained above, in the nonvolatile memory element according to the present invention, charges can be easily injected from the semiconductor film to the floating gate electrode, and charges are prevented from going out from the floating gate electrode. In other words, when the nonvolatile memory element operates as a memory, data can be written highly efficiently at low voltage, and a charge storing property can be improved.

This embodiment mode can be combined with Embodiment Mode 1 as appropriate, thereby reducing power consumption. In addition, this embodiment mode can be combined with any of the other embodiment modes and embodiment than Embodiment Mode 1 as appropriate.

Embodiment Mode 3

Embodiment Mode 3 will describe an example of a nonvolatile semiconductor memory device is described with reference to drawings. Note that this embodiment mode shows a nonvolatile semiconductor memory device in the case where nonvolatile memory elements included in a memory portion and elements such as transistors included in a logic portion, which are formed over the same substrate as the memory portion and conduct control or the like of the memory portion, are formed at the same time.

In the equivalent circuit diagram of the memory portion shown in this embodiment mode, as shown in FIG. 11 described in the above embodiment mode, the NAND cell NS1 having the plurality of nonvolatile memory elements M0 to M30 and M31 is provided between the selection transistor S1 and the source line SL. In FIG. 11, the selection transistor S1 and the NAND cell NS1 form one memory cell.

The gate electrode of the selection transistor S1 is connected to the signal line SG1, and one of the source and drain electrodes of the selection transistor S1 is connected to the bit line BL, while the other is connected to the source or drain electrode of the nonvolatile memory element M31. In addition, the gate electrodes of the nonvolatile memory elements M0 to M31 are connected to the word lines WL0 to WL31, respectively. In addition, one of the source and drain electrodes of the nonvolatile memory element M0 is connected to the source line SL, while the other is connected to the source or drain electrode of the nonvolatile memory element M1.

Note that the first selection gate line SG1 is a wiring for selecting the connection of each memory cell to the bit line.

Note also that the selection transistors provided in the memory portion require a higher driving voltage than the transistors provided in the logic portion; therefore, it is preferable to differentiate the thickness of the gate insulating films and the like of the transistors provided in the memory portion from those of the transistors provided in the logic portion. For example, in order to obtain transistors with low driving voltage and small change in threshold voltage, it is preferable to form thin film transistors having thin gate insulating films. On the other hand, in order to obtain transistors with high driving voltage and gate insulating films with high dielectric strength, it is preferable to form thin film transistors having thick gate insulating films.

Accordingly, this embodiment mode will describe the case of forming a thin insulating film for the transistors in the logic portion, which require a low driving voltage and small change in threshold voltage, and forming a thick insulating film for the transistors in the memory portion, which require a high driving voltage and high dielectric strength of a gate insulating film, referring to the drawings. FIGS. 23 to 25 are top views and FIGS. 26A to 26C, 27A and 27B, 28A to 28C, and 29A to 29C are cross-sectional views taken along lines A-B, C-D, E-F, and G-H in FIGS. 23 to 25. In addition, a region between A and B and a region between C and D show the transistors provided in the logic portion, a region between E and F shows the nonvolatile memory elements and the transistor provided in the memory portion in the direction in which the bit line extends, and a region between G and H shows the nonvolatile memory element provided in the memory portion in the direction in which the word line extends. Although this embodiment mode will describe the case where the thin film transistor provided in the region between A and B is a p-channel transistor and the thin film transistors provided in the region between C and D and the region between E and F are n-channel transistors, the nonvolatile semiconductor memory device of the present invention is not limited to these examples.

First, island-shape semiconductor films 1004, 1006, and 1008, and 1010 are formed over a substrate 1000 with an insulating film 1002 interposed therebetween, and first insulating films 1012, 1014, 1016, and 1018 are formed to cover the island-shape semiconductor films 1004, 1006, 1008, and 1010, respectively. Then, a charge accumulating layer 1020 functioning as the floating gates of the nonvolatile memory elements is formed to cover the first insulating films 1012, 1014, 1016, and 1018 (see FIG. 26A). The island-shape semiconductor films 1004, 1006, 1008, and 1010 can be provided through the steps of forming an amorphous semiconductor film over the insulating film 1002, which has been formed over the substrate 1000 in advance, by a sputtering method, a LPCVD method, a plasma CVD method, or the like, using a material containing silicon (Si) as a main component (e.g., $Si_xGe_{1-x}$) or the like, crystallizing the amorphous semiconductor film, and then selectively etching the crystallized semiconductor film. Note that crystallization of the amorphous semiconductor film can be conducted by a laser crystallization method, a thermal crystallization method using rapid thermal annealing (RTA) or an annealing furnace, a thermal crystallization method using a metal element which promotes the crystallization, or a method combining them.

In the case of conducting crystallization or recrystallization of the semiconductor film by laser irradiation, an LD-pumped continuous wave (CW) laser (e.g., $YVO_4$, a second harmonic (wavelength of 532 nm)) can be used as a laser light source. Although the frequency is not specifically limited to the second harmonic, the second harmonic is superior to harmonics higher than that in terms of energy efficiency. When a semiconductor film is irradiated with CW laser, the semiconductor film can be continuously given energy. Therefore, once the semiconductor film is made into a molten state, the molten state can be retained. Furthermore, by scanning the semiconductor film with CW laser, a solid-liquid interface of the semiconductor film can be moved, and crystal grains which are long in one direction can be formed along the moving direction. The reason for using a solid-state laser is that more stable output can be obtained by using a solid-state laser than by using a gas laser or the like, and thus more stable treatment can be expected. Note that the laser light source is not limited to a CW laser and a pulsed laser with a repetition rate of 10 MHz or higher can also be used. When a pulsed laser with a high repetition rate is used, a semiconductor film can be constantly retained in the molten state on the condition that a pulse interval of laser is shorter than a time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, ceramic lasers such as a YAG laser, a $Y_2O_3$ laser, a $GdVO_4$ laser, and a $YVO_4$ laser can also be used. As a metal vapor laser, a helium-cadmium laser and the like can be given as examples. Laser light is preferably emitted from a laser oscillator with $TEM_{00}$ (single transverse mode), which can increase the energy uniformity of a linear beam spot that is obtained on the irradiation surface. Besides, a pulsed excimer laser may also be used.

The substrate 1000 can be selected from a glass substrate, a quartz substrate, a metal substrate (e.g., a ceramic substrate or a stainless steel substrate), or a semiconductor substrate such as a Si substrate. Alternatively, a plastic substrate made of polyethylene terephthalate (PET), polyethylene naphthalate (PEN), polyethersulfone (PES), acrylic, or the like can be used.

The insulating film 1002 is formed by a CVD method, a sputtering method, or the like, using an insulating material such as silicon oxide, silicon nitride, silicon oxynitride ($SiO_xN_y$), (x>y>0), or silicon nitride oxide ($SiN_xO_y$) (x>y>0). For example, when the insulating film 1002 is formed to have a two-layer structure, it is preferable to form a silicon nitride oxide film as a first-layer insulating film, and form a silicon oxynitride film as a second-layer insulating film. Alternatively, it is also possible to form a silicon nitride film as a first-layer insulating film and form a silicon oxide film as a second-layer insulating film. In this manner, formation of the insulating film 1002 functioning as a blocking layer can prevent adverse effects of alkali metals such as Na or alkaline earth metals contained in the substrate 1000 which would otherwise be diffused into elements formed above the substrate. Note that when quartz is used as the substrate 1000, the insulating film 1002 may be omitted.

Note that although this embodiment exemplarily shows thin film transistors as the transistors formed using the island-shape semiconductor films over the substrate 1000, the present invention is not limited to this example. For example, the substrate 1000 can be a single crystalline Si substrate having n-type or p-type conductivity, a compound semiconductor substrate (a GaAs substrate, an InP substrate, a GaN substrate, a SiC substrate, a sapphire substrate, a ZnSe substrate, or the like), an SOI (Silicon on Insulator) substrate formed by a bonding method or a SIMOX (Separation by IMplanted OXygen) method, or the like. Therefore, it is possible to form island-shape semiconductor films using single crystalline silicon and form transistors with the films.

In the case of using a single crystalline Si substrate, a compound semiconductor substrate, or an SOI substrate, an element isolation region can be formed using a LOCOS (LOCal Oxidation of Silicon) method, a trench isolation method, or the like as appropriate. In addition, a p well in the semiconductor substrate can be formed by selectively doping the semiconductor substrate with an impurity element having p-type conductivity. As the impurity element having p-type conductivity, boron (B), aluminum (Al), gallium (Ga), or the like can be used.

The first insulating films 1012, 1014, 1016, and 1018 can be formed by applying a thermal treatment, a plasma treatment, or the like to the surfaces of the semiconductor films 1004, 1006, 1008, and 1010. For example, the first insulating films 1012, 1014, 1016, and 1018 to be oxide films, nitride films, or oxynitride films are formed on the semiconductor films 1004, 1006, 1008, and 1010, respectively by oxidizing, nitriding, or oxynitriding the surfaces of the semiconductor films 1004, 1006, 1008, and 1010 by a high-density plasma treatment. Note that a plasma CVD method or a sputtering method can also be employed.

For example, in the case where an oxidation treatment or a nitridation treatment is applied to the surfaces of the semiconductor films 1004, 1006, 1008, and 1010 which contain silicon as main components by a high-density plasma treatment, silicon oxide ($SiO_x$) films or silicon nitride ($SiN_x$) films are formed as the first insulating films 1012, 1014, 1016, and 1018. Alternatively, it is also possible that after applying an oxidation treatment to the surfaces of the semiconductor films 1004, 1006, 1008, and 1010 by a high-density plasma treatment, another high-density plasma treatment may be conducted to nitride the surfaces of the semiconductor films 1004, 1006, 1008, and 1010. In that case, silicon oxide films are formed in contact with the semiconductor films 1004, 1006, 1008, and 1010 and films containing oxygen and nitrogen (hereinafter referred to as "silicon oxynitride films") are formed on the silicon oxide films. That is, films each having a stack of the silicon oxide film and the silicon oxynitride film are formed as the first insulating films 1012, 1014, 1016, and 1018.

Here, the first insulating films 1012, 1014, 1016, and 1018 are formed with a thickness of 1 to 10 nm, preferably 1 to 5 nm. For example, after forming silicon oxide films with a thickness of about 5 nm on the surfaces of the semiconductor films 1004, 1006, 1008, and 1010 by applying a high-density plasma oxidation treatment to the semiconductor films 1004, 1006, 1008, and 1010, a high-density plasma nitridation treatment is conducted so that nitrogen-plasma-treated layers are formed on the surfaces of the silicon oxide films or in the vicinity of the surfaces. Specifically, the silicon oxide layer 16a is formed first on the semiconductor film 14 with a thickness of 3 nm to 6 nm by a plasma treatment under an oxygen atmosphere, and then the nitrogen-plasma-treated layer having a high concentration of nitrogen is formed on the surface of the silicon oxide layer or in the vicinity of the surface by a plasma treatment under a nitrogen atmosphere. Here, by conducting the plasma treatment under the nitrogen atmosphere, a structure is obtained in which the silicon oxide layer contains 20 to 50 atomic % nitrogen in a region from the surface to a depth of about 1 nm. In the nitrogen-plasma treated layer, silicon containing oxygen and nitrogen (silicon oxynitride) is formed. At this time, the high-density plasma oxidation treatment and the high-density plasma nitridation treatment are preferably conducted continuously without exposure to the atmosphere. By continuously conducting such high-density plasma treatments, intrusion of contaminants can be prevented and production efficiency can be improved.

Note that in the case of oxidizing the semiconductor film by a high-density plasma treatment, the plasma treatment is conducted under an oxygen atmosphere (e.g., an atmosphere containing oxygen ($O_2$) or dinitrogen monoxide ($N_2O$) and a rare gas (at least one of He, Ne, Ar, Kr, and Xe); or an atmosphere containing oxygen or dinitrogen monoxide, and hydrogen ($H_2$) and a rare gas). On the other hand, in the case of conducting nitriding the semiconductor film by a high-density plasma treatment, the plasma treatment is conducted under a nitrogen atmosphere (e.g., an atmosphere containing nitrogen ($N_2$) and a rare gas (at least one of He, Ne, Ar, Kr, and Xe); an atmosphere containing nitrogen, hydrogen, and a rare gas; or an atmosphere containing $NH_3$ and a rare gas).

As the rare gas, Ar can be used, for example. Alternatively, a mixed gas of Ar and Kr may also be used. In the case of conducting a high-density plasma treatment in a rare gas atmosphere, the first insulating films 1012, 1014, 1016, and 1018 may contain the rare gas used for the plasma treatment (at least one of He, Ne, Ar, Kr, and Xe). When Ar is used, the first insulating films 1012, 1014, 1016, and 1018 may contain Ar.

The high-density plasma treatment is conducted in the above gas atmosphere with a plasma electron density of $1 \times 10^{11}$ cm$^{-3}$ or more and a plasma electron temperature of 1.5 eV or lower. More specifically, the high-density plasma treatment is conducted with an electron density of $1 \times 10^{11}$ to $1 \times 10^{13}$ cm$^{-3}$, and an electron temperature of 0.5 to 1.5 eV. With such high plasma electron density and low plasma electron temperature in the vicinity of the processing object (which corresponds to the semiconductor films 1004, 1006, 1008, and 1010, here) formed over the substrate 1000, damage on the processing object resulting from the plasma can be prevented. In addition, since the plasma electron density is set as high as $1 \times 10^{11}$ cm$^{-3}$ or more, an oxide film or a nitride film formed by oxidizing or nitriding the processing object by a plasma treatment is superior to a film formed by a CVD method, a sputtering method, or the like in uniformity of the film thickness and the like, and thus a dense film can be formed. Furthermore, since the plasma electron temperature is set as low as 1.5 eV or lower, an oxidation or nitridation treatment can be conducted at a temperature lower than that of the conventional plasma treatment or thermal oxidation treatment. For example, even when the plasma treatment is conducted at a temperature lower than the strain point of a glass substrate by 100° C. or more, an oxidation or nitridation treatment can be sufficiently conducted. As a frequency for generating plasma, high frequency such as microwaves (e.g., 2.45 GHz) can be used.

In this embodiment mode, in the case of oxidizing a processing object by a high-density plasma treatment, a mixed gas of oxygen ($O_2$), hydrogen ($H_2$), and argon (Ar) is introduced. The mixed gas used here may be introduced with an oxygen flow rate of 0.1 to 100 sccm, a hydrogen flow rate of 0.1 to 100 sccm, and an argon flow rate of 100 to 5000 sccm. Note that the mixed gas is preferably introduced with a ratio of oxygen:hydrogen:argon=1:1:100. For example, the mixed gas may be introduced with an oxygen flow rate of 5 sccm, a hydrogen flow rate of 5 sccm, and an argon flow rate of 500 sccm.

In the case of conducting nitridation by a high-density plasma treatment, a mixed gas of nitrogen ($N_2$) and argon (Ar) is introduced. The mixed gas used here may be introduced with a nitrogen flow rate of 20 to 2000 sccm and an argon flow rate of 100 to 10000 sccm. For example, the mixed gas may be introduced with a nitrogen flow rate of 200 sccm and an argon flow rate of 1000 sccm.

In this embodiment mode, the first insulating film 1016 formed on the semiconductor film 1008 which is provided in the memory portion functions as a tunnel insulating film of a nonvolatile memory element which is completed later. Thus, the thicker the first insulating film 1016 is, the easier it will be for tunnel current to flow, and thus higher-speed operation of the memory can be achieved. Meanwhile, the thinner the first insulating film 1016 is, the easier it will be for charges to be accumulated in a floating gate which is formed later with a low voltage, and thus lower power consumption of the nonvolatile semiconductor memory device can be achieved. Therefore, the first insulating films 1012, 1014, 1016, and 1018 are preferably formed to be thin.

As a general method for forming a thin insulating film over a semiconductor film, there is a thermal oxidation method. However, when a substrate which does not have a sufficiently high melting point, such as a glass substrate is used as the substrate 1000, it is quite difficult to form the first insulating films 1012, 1014, 1016, and 1018 by a thermal oxidation method. In addition, an insulating film formed by a CVD method or a sputtering method does not have a sufficient film quality due to its internal defects, and has a problem in that defects such as pin holes are produced when the film is formed to be thin. Furthermore, when an insulating film is formed by the CVD method or the sputtering method, the coverage of the end portion of the semiconductor film is not enough, and there may be a case where a conductive film or the like which is formed over the first insulating film 1016 later short out with the semiconductor film. Thus, by forming the first insulating films 1012, 1014, 1016, and 1018 by a high-density plasma treatment as shown in this embodiment mode, insulating films which are denser than an insulating film formed by a CVD method, a sputtering method, or the like can be formed. Furthermore, the end portions of the semiconductor films 1004, 1006, 1008, and 1010 may be sufficiently covered with the first insulating films 1012, 1014, 1016, and 1018, respectively. As a result, high-speed operation of the memory can be achieved and the charge storing property can be improved. Note that in the case of forming the first insulating films 1012, 1014, 1016, and 1018 by a CVD method or a sputtering method, it is preferable to apply oxidation, nitridation, or oxynitridation treatment to the surfaces of the insulating films by a high-density plasma treatment after forming the insulating films.

The charge accumulating layer 1020 can be formed using a film of silicon (Si), germanium (Ge), a silicon-germanium alloy, or the like. Note that in this embodiment mode, it is particularly preferable to form the charge accumulating layer 1020 using a film containing germanium such as germanium (Ge) or a silicon-germanium alloy. Here, a film containing germanium as a main component is formed as the charge accumulating layer 1020 with a thickness of 1 to 20 nm, preferably 5 to 10 nm by conducting a plasma CVD method in an atmosphere containing a germanium element (e.g., $GeH_4$). Note that the charge accumulating layer 1020 formed over the semiconductor film 1008 which is provided in the memory portion functions as the floating gate of the nonvolatile memory element which is completed later. As described above, when a semiconductor film is formed using a material containing Si as a main component, and a film containing germanium which has a lower energy gap than Si is provided as a charge accumulating layer over the semiconductor film with a first insulating film functioning as the tunnel oxide film interposed therebetween, a second barrier against charges of the charge accumulating layer which is formed by the insulating film has higher energy than a first barrier against charges of the semiconductor film which is formed by the insulating film. As a result, injection of charges into the charge accumulating layer from the semiconductor film can be facilitated, and charges in the charge accumulating layer can be prevented from going out. That is, when the nonvolatile memory element of the present invention operates as a memory, highly efficient write can be conducted with a low voltage, and the charge storing property can be improved.

Note that the charge accumulating layer 1020 may be formed to have either a single layer or a plurality of layers made from silicon nitride, germanium nitride, and/or silicon germanium nitride. When the charge accumulating layer 1020 is formed using silicon nitride, germanium nitride, and/or silicon germanium nitride, a plurality of trap levels in the nitride film can be utilized to trap (capture) charges which are injected from the semiconductor film through the tunnel oxide film, even though the nitride film is an insulating film. That is, by forming the charge accumulating layer 1020 using silicon nitride, germanium nitride, and/or silicon germanium nitride, charges can be trapped at the plurality of trap levels. Thus, even when there is a defect in a part of the tunnel insulating film, only a part of the accumulated charges disappears, and thus charges can be continuously trapped. Therefore, the thickness of the tunnel oxide film can be further reduced, and a highly reliable nonvolatile memory element can be obtained in terms of the charge storing property, which is preferable. Furthermore, by forming the charge accumulating layer 1020 using silicon nitride, germanium nitride, and/or silicon germanium nitride, the thickness of the tunnel oxide film can be reduced, and thus, the nonvolatile memory element itself can be miniaturized, which is preferable.

Next, the first insulating films 1012 and 1014 and the charge accumulating layer 120 which are formed over the semiconductor films 1004 and 1006 are selectively removed, so that the first insulating film 1016 and the charge accumulating layer 1020 formed over the semiconductor film 1008, and the first insulating film 1018 and the charge accumulating layer 1020 formed over the semiconductor film 1010 remain. Here, the semiconductor films 1008, and 1010, the first insulating films 1016, and 1018, and the charge accumulating layer 1020 provided in the memory portion are selectively covered with a resist, and then the first insulating films 1012 and 1014 and the charge accumulating layer 120 which are formed over the semiconductor films 1004 and 1006 are selectively removed by etching (see FIG. 26B).

Next, the semiconductor films 1004 and 1006 and a part of the charge accumulating layer 1020 formed over the semiconductor films 1008 and 1010 are selectively covered with a resist 1022, and a part of the charge accumulating layer 1020 that is not covered with the resist 1022 is selectively removed by etching, so that a part of the charge accumulating layer 1020 remains and charge accumulating layers 1021 are formed (see FIG. 26C and FIG. 25).

Figure 27A:
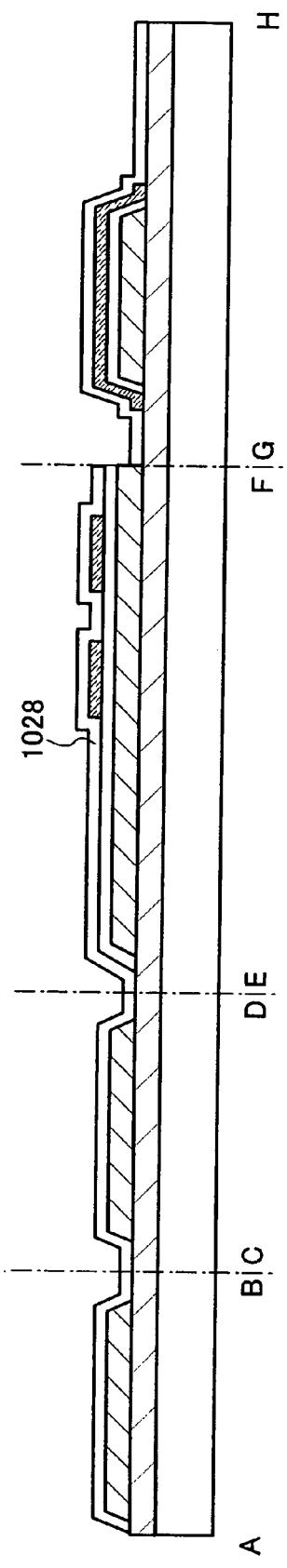
FIGS. 27A and 27B show an example of a manufacturing method of a nonvolatile semiconductor memory device according to an aspect of the present invention.

Next, a second insulating film 1028 is formed to cover the semiconductor films 1004 and 1006, the first insulating films 1016 and 1018 and the charge accumulating layers 1021 which are formed over the semiconductor films 1008 and 1010 (see FIG. 27A).

The second insulating film 1028 is formed to have either a single layer or stacked layers by a CVD method, a sputtering method, or the like, using an insulating material such as silicon oxide, silicon nitride, silicon oxynitride ($SiO_xN_y$) (x>y>0), or silicon nitride oxide ($SiN_xO_y$) (x>y>0). For example, in the case of providing the second insulating film 1028 with a single layer, a silicon oxynitride film or a silicon nitride oxide film is formed with a thickness of 5 to 50 nm by a CVD method. Meanwhile, in the case of providing the second insulating film 1028 with a three-layer structure, a silicon oxynitride film may be formed as a first-layer insulating film, a silicon nitride film may be formed as a second-layer insulating film, and a silicon oxynitride film may be formed as a third-layer insulating film. Alternatively, the second insulating film 1028 can be formed using an oxide or nitride of germanium, hafnium oxide ($HfO_x$), or tantalum oxide ($TaO_x$).

Note that the second insulating film 1028 formed over the semiconductor films 1008 and 1010 functions as a control insulating film of the nonvolatile memory element which is completed later.

Figure 27B:
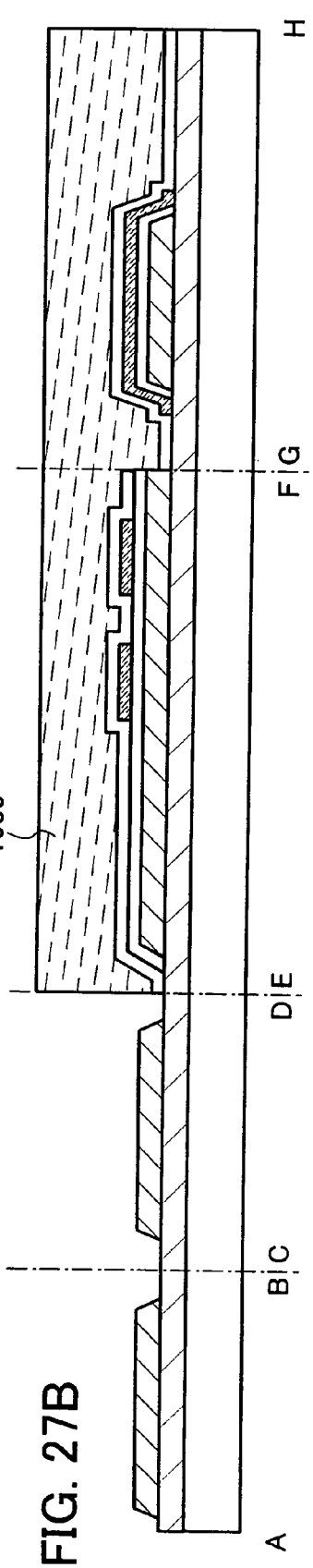

Next, a resist 1030 is selectively formed to cover the second insulating film 1028 which is formed over the semiconductor films 1008 and 1010, and then the second insulating film 1028 formed over the semiconductor films 1004 and 1006 are selectively removed (see FIG. 27B).

Figure 28A:
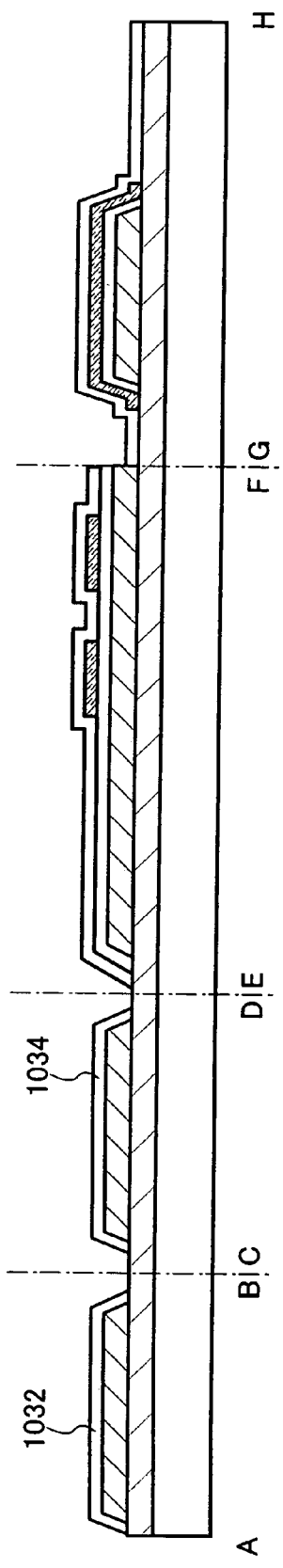
FIGS. 28A to 28C show an example of a manufacturing method of a nonvolatile semiconductor memory device according to an aspect of the present invention.

Next, third insulating films 1032 and 1034 are formed to cover the semiconductor films 1004 and 1006, respectively (see FIG. 28A).

The third insulating films 1032 and 1034 are formed by using any of the above-described methods for forming the first insulating films 1012, 1014, 1016, and 1018. For example, by applying an oxidation, nitridation, or oxynitridation treatment to the surfaces of the semiconductor films 1004 and 1006 by a high-density plasma treatment, the third insulating films 1032 and 1034, each of which is made of a silicon oxide film, a silicon nitride film, or a silicon oxynitride film, are formed on the semiconductor films 1004 and 1006, respectively.

Here, the third insulating films 1032 and 1034 are formed with a thickness of 1 to 20 nm, preferably 1 to 10 nm. For example, after forming silicon oxide films on the surfaces of the semiconductor films 1004 and 1006 by a high-density plasma oxidation treatment, a high-density plasma nitridation treatment is conducted so that nitrogen-plasma-treated layers are formed on the surfaces of the silicon oxide films or in the vicinity of the surfaces. In this case, the surface of the second insulating film 1028 formed over the semiconductor film 1008 is also oxidized or nitrided, so that an oxide film or an oxynitride film is formed. The third insulating films 1032 and 1034 formed over the semiconductor films 1004 and 1006 function as the gate insulating films of the transistors which are completed later.

Figure 28B:
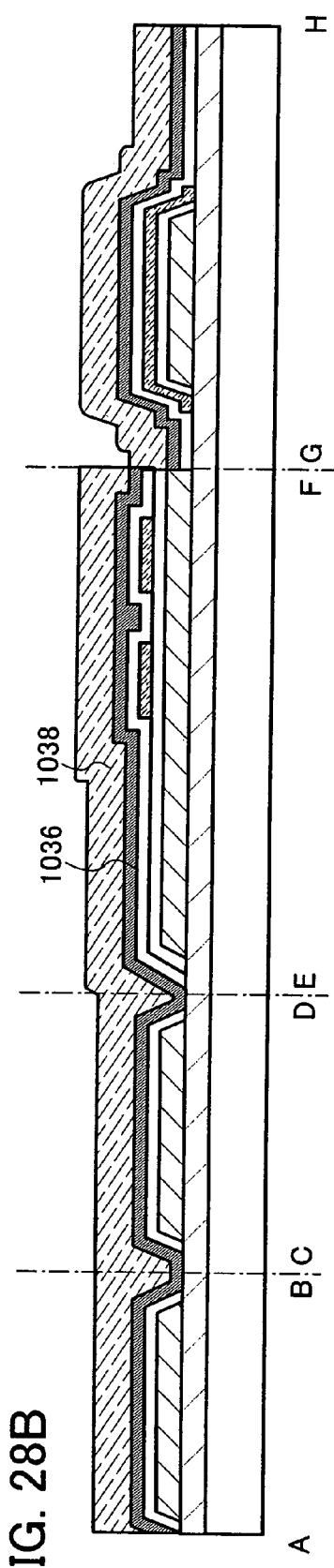
Figure 28C:
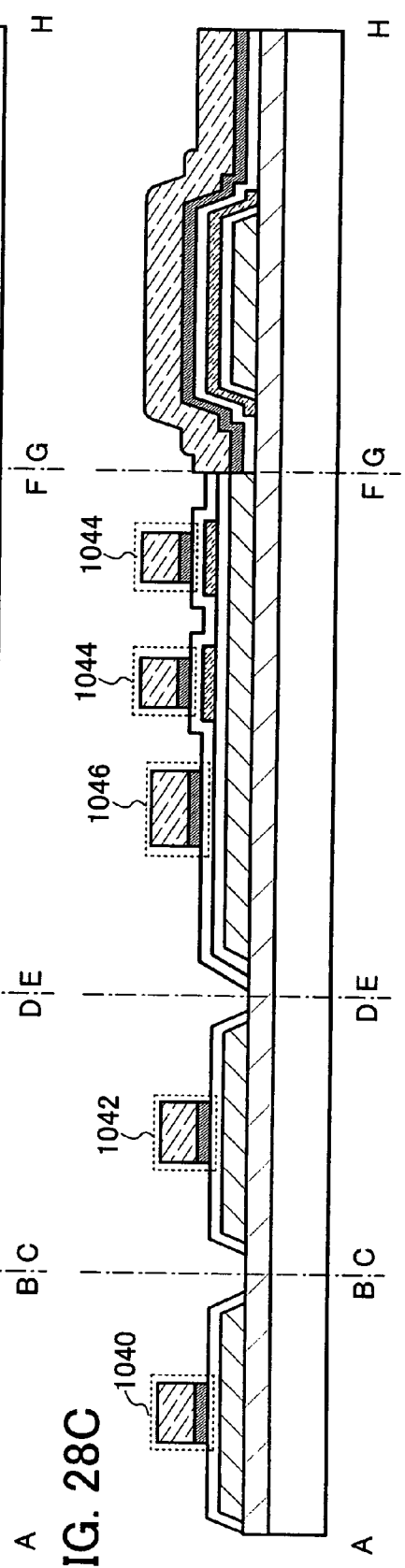

Next, a conductive film is formed so as to cover the third insulating films 1032 and 1034 formed over the semiconductor films 1004 and 1006 and the second insulating film 1028 formed over the semiconductor films 1008 and 1010 (see FIG. 28B). Here, an example is shown where a conductive film 1036 and a conductive film 1038 are sequentially stacked as the conductive film. Needless to say, the conductive film may be formed to have a single layer or a stacked structure with more than two layers.

The conductive films 1036 and 1038 can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. It is also possible to use a metal nitride film which is formed by nitriding the above element. Furthermore, it is also possible to use a semiconductor material typified by polysilicon which is doped with an impurity element such as phosphorus.

Here, a stacked structure is employed such that the conductive film 1036 is formed using tantalum nitride, and the conductive film 1038 is formed thereover using tungsten. Alternatively, it is also possible to form the conductive film 1036 with a single layer or a stacked film, using tungsten nitride, molybdenum nitride, and/or titanium nitride, and form the conductive film 1038 with a single layer or a stacked film, using tantalum, molybdenum, and/or titanium.

Next, the stacked conductive films 1036 and 1038 are selectively removed by etching, so that the conductive films 1036 and 1038 partially remain over the semiconductor films 1004, 1006, and 1008. As a result, conductive films 1040, 1042, 1044, and 1046 functioning as gate electrodes are formed (see FIG. 28C and FIG. 24). Note that the conductive films 1044 formed over the semiconductor film 1008 which is provided in the memory portion function as the control gates of the nonvolatile memory elements which are completed later. Meanwhile, the conductive films 1040, 1042, and 1046 function as the gate electrodes of the transistors which are completed later.

Next, a resist 1048 is selectively formed to cover the semiconductor film 1004, and the semiconductor films 1006 and 1008 are doped with an impurity element by using the resist 1048 and the conductive films 1042, 1044, and 1046 as masks, thereby forming impurity regions (see FIG. 29A). As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

In FIG. 29A, by doping the semiconductor films 1006 and 1008 with an impurity element, an impurity region 1052 for forming a source region or a drain region, and a channel forming region 1050 are formed in the semiconductor film 1006, while an impurity region 1056 for forming a source region or a drain region, a low concentration impurity region 1058 for forming an LDD (Lightly Doped Drain) region, and a channel forming region 1054 are formed in the semiconductor film 1008. In addition, an impurity region 1062 for forming a source region or a drain region and a channel forming region 1060 are also formed in the semiconductor film 1008.

The low concentration impurity region 1058 formed in the semiconductor film 1008 is made from the impurity element which has been introduced in FIG. 29A and has passed through the charge accumulating region 1021 functioning as the floating gate. Thus, the channel forming region 1054 is formed in a part of the semiconductor film 1008 which overlaps with both the conductive film 1044 and the charge accumulating layer 1021; the low concentration impurity region 1058 is formed in a part of the semiconductor film 1008 which overlaps with the charge accumulating layer 1021 but does not overlap with the conductive film 1044; and the high concentration impurity region 1056 is formed in a part of the semiconductor film 1008 which overlaps with neither the charge accumulating layer 1021 nor the conductive film 1044.

Note that it is also possible to make the size or the position of the charge accumulating layer 1021 and the conductive film 1044 different from each other. Thus, the doping process of the semiconductor film of the nonvolatile memory element with an n-type impurity element or a p-type impurity element can be selectively conduced and also the concentration of the impurity element can be selectively varied.

Next, a resist 1066 is selectively formed to cover the semiconductor films 1006 1008, and 1010, and the semiconductor film 1004 is doped with an impurity element using the resist 1066 and conductive film 1040 as masks, so that an impurity region is formed (see FIG. 29B). As the impurity element, either an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. Here, an impurity element (e.g., boron (B)), which has a different conductivity type from the impurity element introduced into the semiconductor films 1006 and 1008 in FIG. 29A, is introduced. As a result, an impurity region 1070 for forming a source region or a drain region and a channel forming region 1068 are formed in the semiconductor film 1004.

Next, insulating films 1072 are formed to cover the second insulating film 1028, the third insulating films 1032 and 1034, and the conductive films 1040, 1042, 1044, and 1046. Then, conductive films 1074 are formed over the insulating films 1072, which are electrically connected to the impurity regions 1052, 1062, and 1070 formed in the semiconductor films 1004, 1006, and 1008 (see FIG. 29C and FIG. 23). Note that the conductive film 1074 which is electrically connected to the impurity region 1062 serves as a bit line BL0.

The insulating film 1072 can be formed to have either a single-layer structure or a stacked structure by a CVD method, a sputtering method, or the like, using an insulating film containing oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as a diamond like carbon (DLC); an organic material such as epoxy, polyimide, polyamide, polyvinyl phenol, benzocyclobutene, or acrylic; or a siloxane material such as a siloxane resin. Note that a siloxane material corresponds to a material having a Si—O—Si bond. Siloxane has a skeletal structure with the bond of silicon (Si) and oxygen (O). As a substituent of siloxane, an organic group containing at least hydrogen (e.g., an alkyl group or an aryl group) can be used. Further, a fluoro group may be used as the substituent, or both a fluoro group and an organic group containing at least hydrogen may be used as the substituent.

The conductive film 1074 is formed to have either a single-layer structure or a stacked structure by a CVD method, a sputtering method, or the like, using an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material containing aluminum as a main component and also containing nickel, or an alloy material containing aluminum as a main component and also containing nickel and one or both of carbon and silicon. The conductive film 1074 is preferably formed to have a stacked structure of a barrier film, an aluminum silicon (Al—Si) film, and a barrier film, or a stacked structure of a barrier film, an aluminum silicon (Al—Si) film, a titanium nitride (TiN) film, and a barrier film. Note that the barrier film corresponds to a thin film made of titanium, titanium nitride, molybdenum, or molybdenum nitride. Aluminum and aluminum silicon, which have a low resistance value and are inexpensive, are suitable for the material of the conductive film 1074. In addition, by providing the barrier layers in the top layer and the bottom layer, generation of hillocks of aluminum or aluminum silicon can be prevented. Furthermore, when a barrier film made of titanium which is an element having a high reducing property is formed, even if a thin natural oxide film is formed on the crystalline semiconductor film, the natural oxide film can be reduced and an excellent contact between the barrier film and the crystalline semiconductor film can be obtained.

In this manner, the transistors provided in the logic portion, the transistors provided in the memory portion (here, the selection transistor S1) and the nonvolatile memory elements M0 to M31 are formed.

This embodiment mode can be combined with any of the other embodiment modes and embodiment in this specification as appropriate.

Embodiment 1

Embodiment 1 will describe examples of the application of a semiconductor device which is provided with the above nonvolatile semiconductor memory device of the present invention and is capable of wireless data communication, with reference to drawings. A semiconductor device capable of wireless data communication is also called an RFID tag, an ID tag, an IC tag, an IC chip, an RF tag, a wireless tag, an electronic tag, or a wireless chip depending on the use application.

Figure 30A:
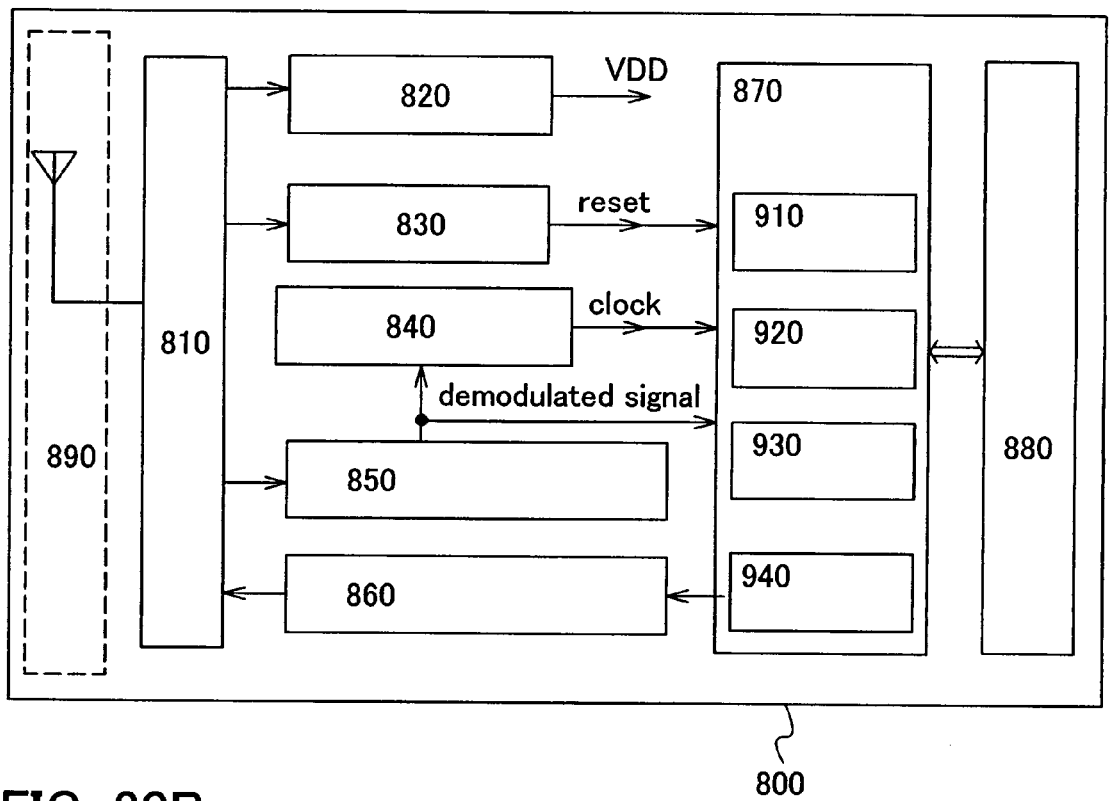
FIGS. 30A to 30C show an example of application use of a nonvolatile semiconductor memory device according to an aspect of the present invention.

A semiconductor device 800 has a function of wireless data communication, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 30A). The high-frequency circuit 810 is a circuit which receives a signal from the antenna 890, and outputs a signal which has been received from the data modulation circuit 860 to the antenna 890; the power supply circuit 820 is a circuit which generates power supply potentials from a received signal; the reset circuit 830 is a circuit which generates a reset signal; the clock generation circuit 840 is a circuit which generates various clock signals based on a received signal input from the antenna 890; the data demodulation circuit 850 is a circuit which demodulates a received signal and outputs it to the control circuit 870; and the data modulation circuit 860 is a circuit which modulates a signal received from the control circuit 870. In addition, the control circuit 870 includes, for example, a code extraction circuit 910, a code judging circuit 920, a CRC judging circuit 930, and an output unit circuit 940. Note that the code extraction circuit 910 is a circuit which extracts a plurality of codes contained in an instruction transmitted to the control circuit 870; the code judging circuit 920 is a circuit which judges the content of the instruction by comparing the extracted code with a reference code; and the CRC circuit 930 is a circuit which detects the presence of transmission errors and the like based on the judged code.

Next, an example of the operation of the above semiconductor device is described. First, the antenna 890 receives a radio signal. When the radio signal is transmitted to the power supply circuit 820 through the high-frequency circuit 810, the power supply circuit 820 generates a high power supply potential (hereinafter referred to as VDD). VDD is supplied to circuits included in the semiconductor device 800. In addition, a signal transmitted to the data demodulation circuit 850 through the high-frequency circuit 810 is demodulated (hereinafter the signal is referred to as a demodulated signal). Furthermore, a signal transmitted to the reset circuit 830 through the high-frequency circuit 810 and the demodulated signal which have passed through the clock generation circuit 840 are transmitted to the control circuit 870. The signal transmitted to the control circuit 870 is analyzed by the code extraction circuit 910, the code judging circuit 920, the CRC judging circuit 930, and the like. Then, data on the semiconductor device which is stored in the memory circuit 880 is output in response to the analyzed signal. The output data of the semiconductor device is encoded in the output unit circuit 940. Furthermore, the encoded data of the semiconductor device 800 is modulated in the data modulation circuit 860, and is transmitted as a radio signal from the antenna 890. Note that the low power supply potential (hereinafter referred to as VSS) is common to the plurality of circuits included in the semiconductor device 800; therefore, GND can be used as the VSS. In addition, the nonvolatile semiconductor memory device of the present invention can be applied to the memory circuit 880. In accordance with the present invention, the nonvolatile semiconductor memory device can reduce the driving voltage; therefore, the wireless communication distance of data can be increased.

In this manner, by communicating signals between the semiconductor device 800 and a reader/writer, data on the semiconductor device can be read out.

The semiconductor device 800 may be either of a type where power supply to each circuit is conducted by electromagnetic waves without providing a power source (battery) or a type where a power source (battery) is built in, and power supply to each circuit is conducted by both the power source (battery) and electromagnetic waves.

Figure 30B:
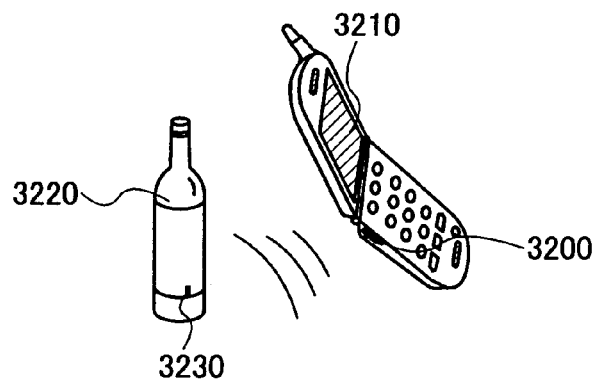
Figure 30C:
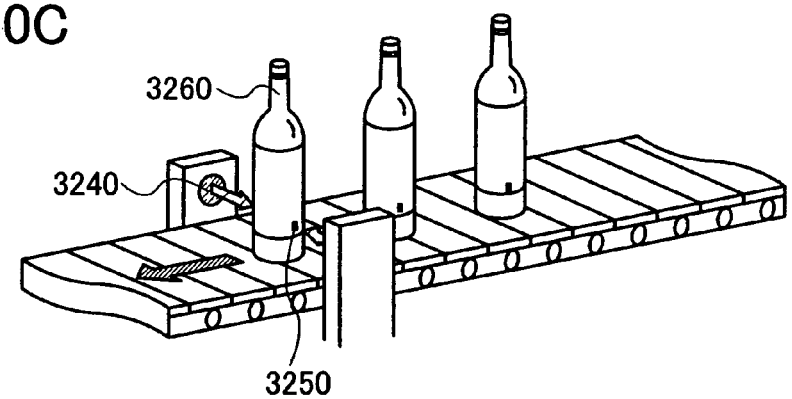

Next, examples of the application of the semiconductor device which can perform wireless data communication are described. A side surface of a portable terminal which includes a display portion 3210 is provided with a reader/writer 3200, and a side surface of a product 3220 is provided with a semiconductor device 3230 (FIG. 30B). When the reader/writer 3200 is put close to the semiconductor device 3230 attached to the product 3220, data on the raw material or source of the product, inspection result in each production step, history of the distribution process, product description, and the like is displayed on the display portion 3210. In addition, when carrying a product 3260 on a belt conveyor, inspection of the product 3260 can be conducted by using a reader/writer 3240 and a semiconductor device 3250 which is attached to the product 3260 (FIG. 30C). In this manner, by using the semiconductor device for a system, data acquisition can be easily conducted, and thus a higher function and higher added value can be realized.

The nonvolatile semiconductor memory device of the present invention can be applied to various fields of electronic devices having memories. For example, the nonvolatile semiconductor memory device of the present invention can be applied to electronic devices such as cameras (e.g., video cameras or digital cameras), goggle displays (e.g., head mounted displays), navigation systems, audio reproducing apparatuses (e.g., car audio or audio component sets), computers, game machines, portable information terminals (e.g., mobile computers, mobile phones, portable game machines, or electronic books), image reproducing devices provided with storage media (specifically, a device for reproducing the content of a storage medium such as a DVD (Digital Versatile Disc) and having a display for displaying the reproduced image), and the like. FIGS. 31A to 31E show specific examples of such electronic devices.

Figure 31A:
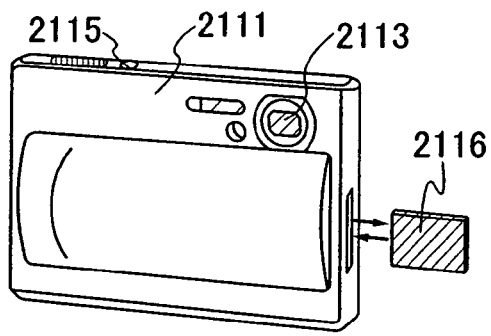
FIGS. 31A to 31E each shows an example of application use of a nonvolatile semiconductor memory device according to an aspect of the present invention.
Figure 31B:
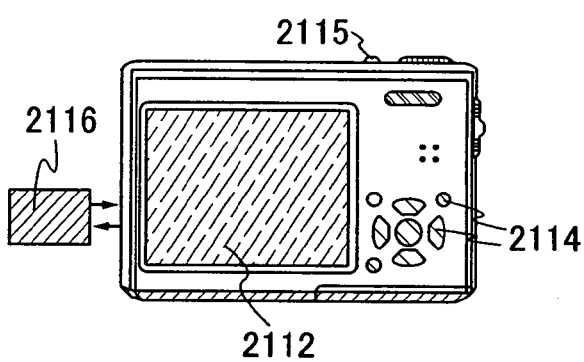

FIGS. 31A and 31B show digital cameras. FIG. 31B shows a rear side of FIG. 31A. This digital camera includes a housing 2111, a display portion 2112, a lens 2113, operating keys 2114, a shutter button 2115, and the like. In addition, the digital camera also includes a removable nonvolatile memory 2116, and data taken by the digital camera is stored in the memory 2116. A nonvolatile semiconductor memory device formed according to the present invention can be applied to the memory 2116.

Figure 31C:
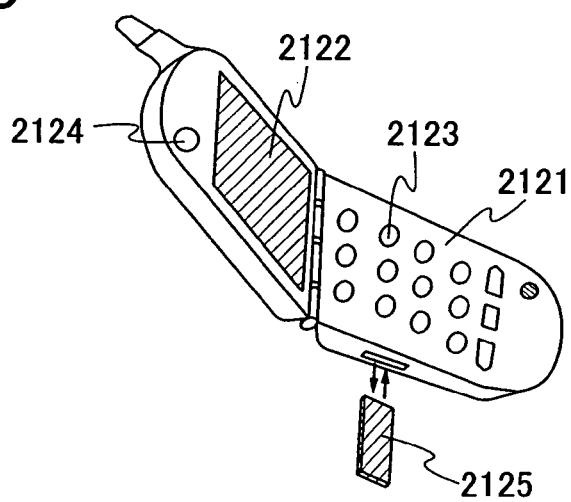

FIG. 31C shows a mobile phone which is one typical example of a portable terminal. This mobile phone includes a housing 2121, a display portion 2122, operating keys 2123, and the like. In addition, the mobile phone also includes a removable nonvolatile memory 2125, and data such as the phone number of the mobile phone, image data, audio data, and the like can be stored in the memory 2125 and reproduced. A nonvolatile semiconductor memory device formed according to the present invention can be applied to the memory 2125.

Figure 31D:
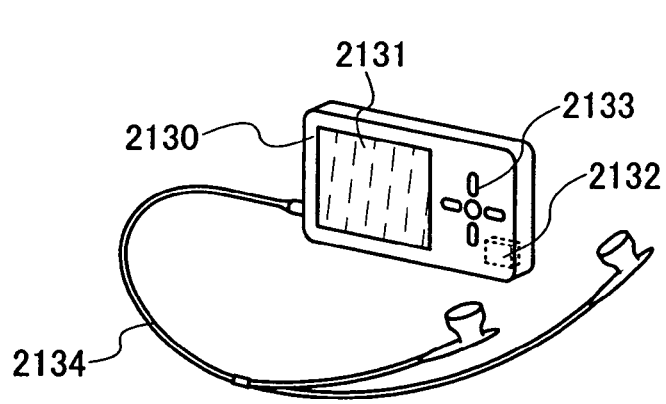

FIG. 31D shows a digital player which is one typical example of an audio device. The digital player shown in FIG. 31D includes a main body 2130, a display portion 2131, a memory portion 2132, operating portions 2133, a pair of earphones 2134, and the like. Note that instead of the pair of earphones 2134, headphones or wireless earphones can be used. A nonvolatile semiconductor memory device formed according to the present invention can be used for the memory portion 2132. For example, by using a NAND-type nonvolatile memory with a storage capacity of 20 to 200 gigabytes (GB), and operating the operating portions 2133, images or audio (music) can be recorded and reproduced. Note that by displaying white text on a black background of the display portion 2131, power consumption can be suppressed. This is particularly effective in the portable audio device. Note also that the nonvolatile semiconductor memory device provided in the memory portion 2132 may be removable.

Figure 31E:
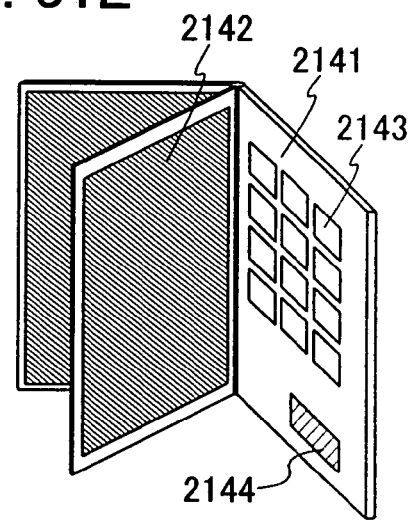

FIG. 31E shows an electronic book (also called electronic paper). This electronic book includes a main body 2141, a display portion 2142, operating keys 2143, and a memory portion 2144. In addition, a modem may be incorporated in the main body 2141, or a structure capable of wireless data transmission/reception may be employed. A nonvolatile semiconductor memory device formed according to the present invention can be used for the memory 2144. For example, by using a NAND-type nonvolatile memory with a storage capacity of 20 to 200 gigabytes (GB), and operating the operating keys 2143, images or audio (music) can be recorded and reproduced. Note that the nonvolatile semiconductor memory device provided in the memory portion 2144 may be removable.

As described above, the applicable range of the nonvolatile semiconductor memory device of the present invention is so wide that the method can be applied to various fields of electronic devices having memories.

Note that this embodiment can be combined with any of the other embodiment modes in this specification as appropriate.

This application is based on Japanese Patent Application serial no. 2006-101262 filed in Japan Patent Office on Mar. 31, 2006 the entire contents of which are hereby incorporated by reference.

What is claimed is:

1. A verify method of a semiconductor device including a NAND cell having a first and second nonvolatile memory elements connected in series, comprising:

setting potential of a control gate of the first nonvolatile memory element to be a first potential and potential of a control gate of the second nonvolatile memory element to be a second potential, for erasing a data stored in the first nonvolatile memory element; and setting potential of a control gate of the first nonvolatile memory element to be a third potential and potential of a control gate of the second nonvolatile memory element to be the second potential, for reading a data stored in the first nonvolatile memory element after erasing a data stored in the first nonvolatile memory element, wherein each of the first and second nonvolatile memo elements has a semiconductor layer including a channel forming region and a floating gate, and wherein the floating gate is formed from a semiconductor material having a smaller energy gap than the semiconductor layer.

2. The verify method according to claim 1,
wherein each of the first and second nonvolatile memory elements has a semiconductor layer including a channel forming region and a floating gate, and
wherein the floating gate is formed from germanium or a germanium compound.

3. The verify method according to claim 1, wherein the semiconductor device is incorporated in at least one of electronic devices selected from the group consisting of a camera, a goggle display, a navigation system, an audio reproducing apparatus, a computer, a game machine, a portable information terminal, and an image reproducing device.

4. The verify method according to claim 1, wherein the semiconductor device is incorporated in at least one of paper money, a coin, securities, a certificate, a bearer bond, a packaging container, a book, a recording media, a vehicle, a food, a clothing, a health product, a commodity, and chemicals.

5. The verify method according to claim 1, wherein the first and second nonvolatile memory elements share a same semiconductor layer.

6. The verify method according to claim 1, wherein the first and second nonvolatile memory elements are formed over a substrate containing silicon.

7. A verify method of a semiconductor device including a NAND cell having a plurality of nonvolatile memory elements connected in series, comprising:

selecting one of the plurality of nonvolatile memory elements;

setting potential of control gates of the plurality of nonvolatile memory elements so that potential of the selected nonvolatile memory element to be a first potential and the other nonvolatile memory elements to be a second potential, while erasing a data stored in the selected nonvolatile memory element; and setting potential of control gates of the plurality of nonvolatile memory elements so that potential of the selected nonvolatile memory element to be a third potential and the other nonvolatile memory elements to be the second potential, while reading a data stored in the selected nonvolatile memory element after erasing a data stored in the selected nonvolatile memory element, wherein each of the plurality of nonvolatile memo elements has a semiconductor layer including a channel forming region and a floating gate, and wherein the floating gate is formed from a semiconductor material having a smaller energy gap than the semiconductor layer.

8. The verify method according to claim 7,
wherein each of the plurality of nonvolatile memory elements has a semiconductor layer including a channel forming region and a floating gate, and
wherein the floating gate is formed from germanium or a germanium compound.

9. The verify method according to claim 7, wherein the semiconductor device is incorporated in at least one of electronic devices selected from the group consisting of a camera, a goggle display, a navigation system, an audio reproducing apparatus, a computer, a game machine, a portable information terminal, and an image reproducing device.

10. The verify method according to claim 7, wherein the semiconductor device is incorporated in at least one of paper money, a coin, securities, a certificate, a bearer bond, a packaging container, a book, a recording media, a vehicle, a food, a clothing, a health product, a commodity, and chemicals.

11. The verify method according to claim 7, wherein the plurality of nonvolatile memory elements share a same semiconductor layer.

12. The verify method according to claim 7, wherein the plurality of nonvolatile memory elements are formed over a substrate containing silicon.

13. A verify method of a semiconductor device including a NAND cell having a first and second nonvolatile memory elements connected in series over a substrate having an insulating surface, comprising:

setting potential of a control gate of the first nonvolatile memory element to be a first potential and potential of a control gate of the second nonvolatile memory element to be a second potential, for erasing a data stored in the first nonvolatile memory element; and setting potential of a control gate of the first nonvolatile memory element to be a third potential and potential of a control gate of the second nonvolatile memory element to be the second potential, for reading a data stored in the first nonvolatile memory element after erasing a data stored in the first nonvolatile memory element, wherein each of the first and second nonvolatile memo elements has a semiconductor layer including a channel forming region and a floating gate, and wherein the floating gate is formed from a semiconductor material having a smaller energy gap than the semiconductor layer.

14. The verify method according to claim 13,
wherein each of the first and second nonvolatile memory elements has a semiconductor layer including a channel forming region and a floating gate, and
wherein the floating gate is formed from germanium or a germanium compound.

15. The verify method according to claim 13, wherein the semiconductor device is incorporated in at least one of electronic devices selected from the group consisting of a camera, a goggle display, a navigation system, an audio reproducing apparatus, a computer, a game machine, a portable information terminal, and an image reproducing device.

16. The verify method according to claim 13, wherein the semiconductor device is incorporated in at least one of paper money, a coin, securities, a certificate, a bearer bond, a packaging container, a book, a recording media, a vehicle, a food, a clothing, a health product, a commodity, and chemicals.

17. The verify method according to claim 13, wherein the first and second nonvolatile memory elements share a same semiconductor layer.

18. The verify method according to claim 13, wherein the first and second nonvolatile memory elements are formed over a substrate containing silicon.

19. The verify method according to claim 13, wherein the substrate having an insulating surface is a glass substrate.

20. A verify method of a semiconductor device including a NAND cell having a plurality of nonvolatile memory elements connected in series over a substrate having an insulating surface, comprising:
   selecting one of the plurality of nonvolatile memory elements;
   setting potential of control gates of the plurality of nonvolatile memory elements so that potential of the selected nonvolatile memory element to be a first potential and the other nonvolatile memory elements to be a second potential, while erasing a data stored in the selected nonvolatile memory element; and
   setting potential of control gates of the plurality of nonvolatile memory elements so that potential of the selected nonvolatile memory element to be a third potential and the other nonvolatile memory elements to be the second potential, while reading a data stored in the selected nonvolatile memory element after erasing a data stored in the selected nonvolatile memory element,
   wherein each of the plurality of nonvolatile memory elements has a semiconductor layer including a channel forming region and a floating gate, and
   wherein the floating gate is formed from a semiconductor material having a smaller energy gap than the semiconductor layer.

21. The verity method according to claim 20,
   wherein each of the plurality of nonvolatile memory elements has a semiconductor layer including a channel forming region and a floating gate, and
   wherein the floating gate is formed from germanium or a germanium compound.

22. The verify method according to claim 20, wherein the semiconductor device is incorporated in at least one of electronic devices selected from the group consisting of a camera, a goggle display, a navigation system, an audio reproducing apparatus, a computer, a game machine, a portable information terminal, and an image reproducing device.

23. The verify method according to claim 20, wherein the semiconductor device is incorporated in at least one of paper money, a coin, securities, a certificate, a bearer bond, a packaging container, a book, a recording media, a vehicle, a food, a clothing, a health product, a commodity, and chemicals.

24. The verify method according to claim 20, wherein the plurality of nonvolatile memory elements share a same semiconductor layer.

25. The verify method according to claim 20, wherein the plurality of nonvolatile memory elements are formed over a substrate containing silicon.

26. The verify method according to claim 20, wherein the substrate having an insulating surface is a glass substrate.

\* \* \* \* \*